United States Patent [19]

Kronlage

[11] 4,079,338

[45] Mar. 14, 1978

[54] I²L RING OSCILLATOR AND METHOD OF FABRICATION

[75] Inventor: John W. Kronlage, Richardson, Tex.

[73] Assignee: Texas Instruments Incorporated, Dallas, Tex.

[21] Appl. No.: 743,993

[22] Filed: Nov. 22, 1976

[51] Int. Cl.² .............................................. H03B 5/02
[52] U.S. Cl. ................... 331/57; 73/359 A; 307/303; 331/108 B; 331/108 C; 331/177 R
[58] Field of Search ................. 331/57, 108 B, 108 C, 331/108 D, 135, 177 R; 307/223 R, 223 C, 303

[56] References Cited

U.S. PATENT DOCUMENTS

| 3,395,362 | 7/1968 | Sutherland | 331/57 |
| 3,428,913 | 2/1969 | Pechoucek | 331/57 |

Primary Examiner—Siegfried H. Grimm

Attorney, Agent, or Firm—Rene' E. Grossman; Stephen S. Sadacca

[57] ABSTRACT

A novel I²L ring oscillator circuit includes means by which the repetition rate is adjustable. A plurality of cascaded logic gate stages are coupled in a ring configuration to achieve a plurality of astable states. Frequency adjustments are made by varying the amount of injection current applied to the logic gates which comprise the ring oscillator. Lowering injection current increases delay time from one astable state to the next resulting in a lower frequency repetition rate. The ring oscillator may be fabricated on a single substrate along with other I²L circuitry and be utilized as the clock source therefore. In one embodiment of the circuit, a plurality of discrete frequency adjustments are provided; by selection of a particular lead pattern during fabrication of the oscillator, the appropriate injection current to the oscillator logic gates is provided.

7 Claims, 39 Drawing Figures

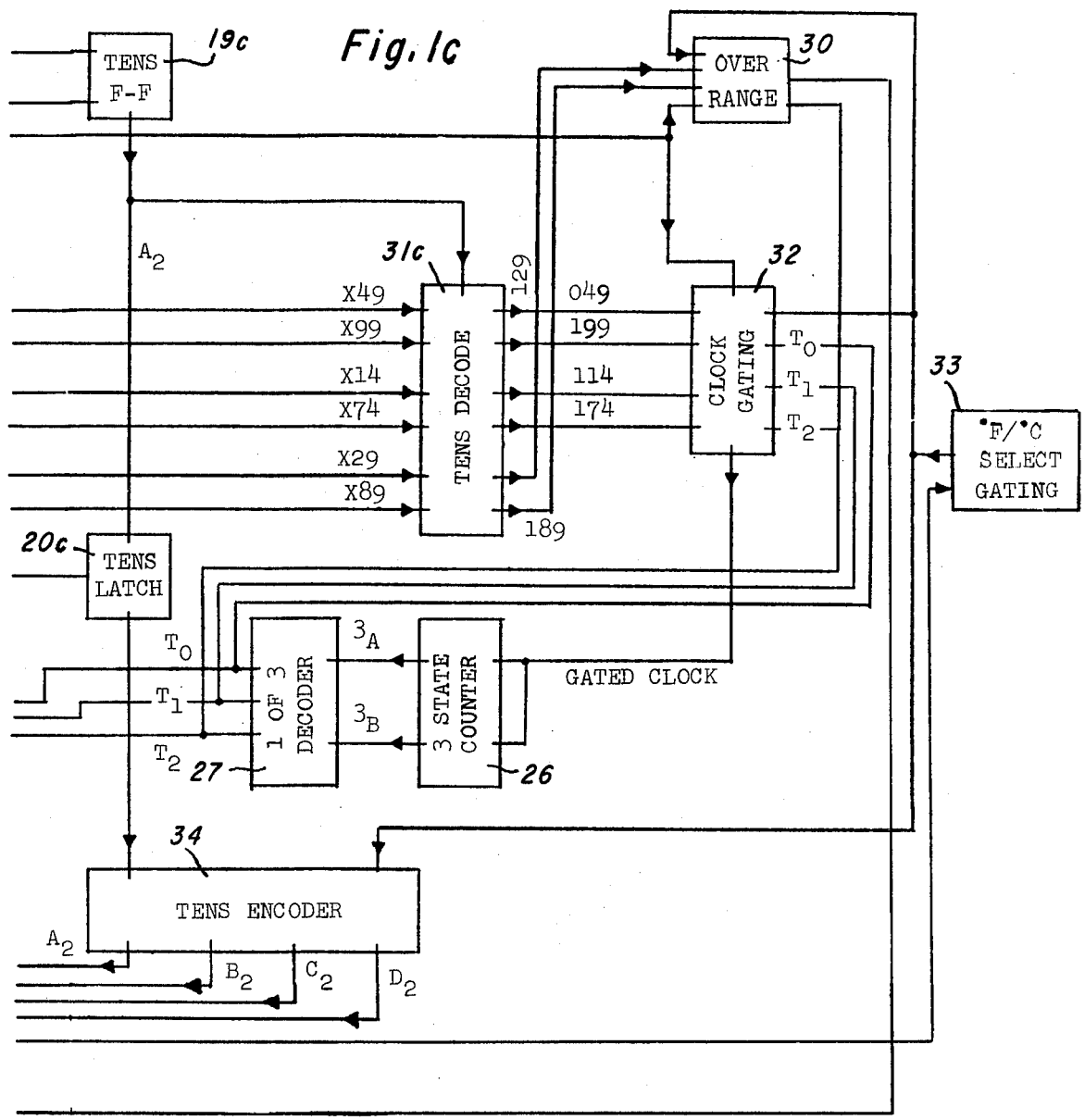

Fig.2

| Fig.2a | Fig.2b | Fig.2c | Fig.2d |
| --- | --- | --- | --- |
| Fig.2e | Fig.2f | Fig.2g | Fig.2h |
| Fig.2i | Fig.2j | Fig.2k | Fig.2l |
| Fig.2m | Fig.2n | Fig.2o | Fig.2p |

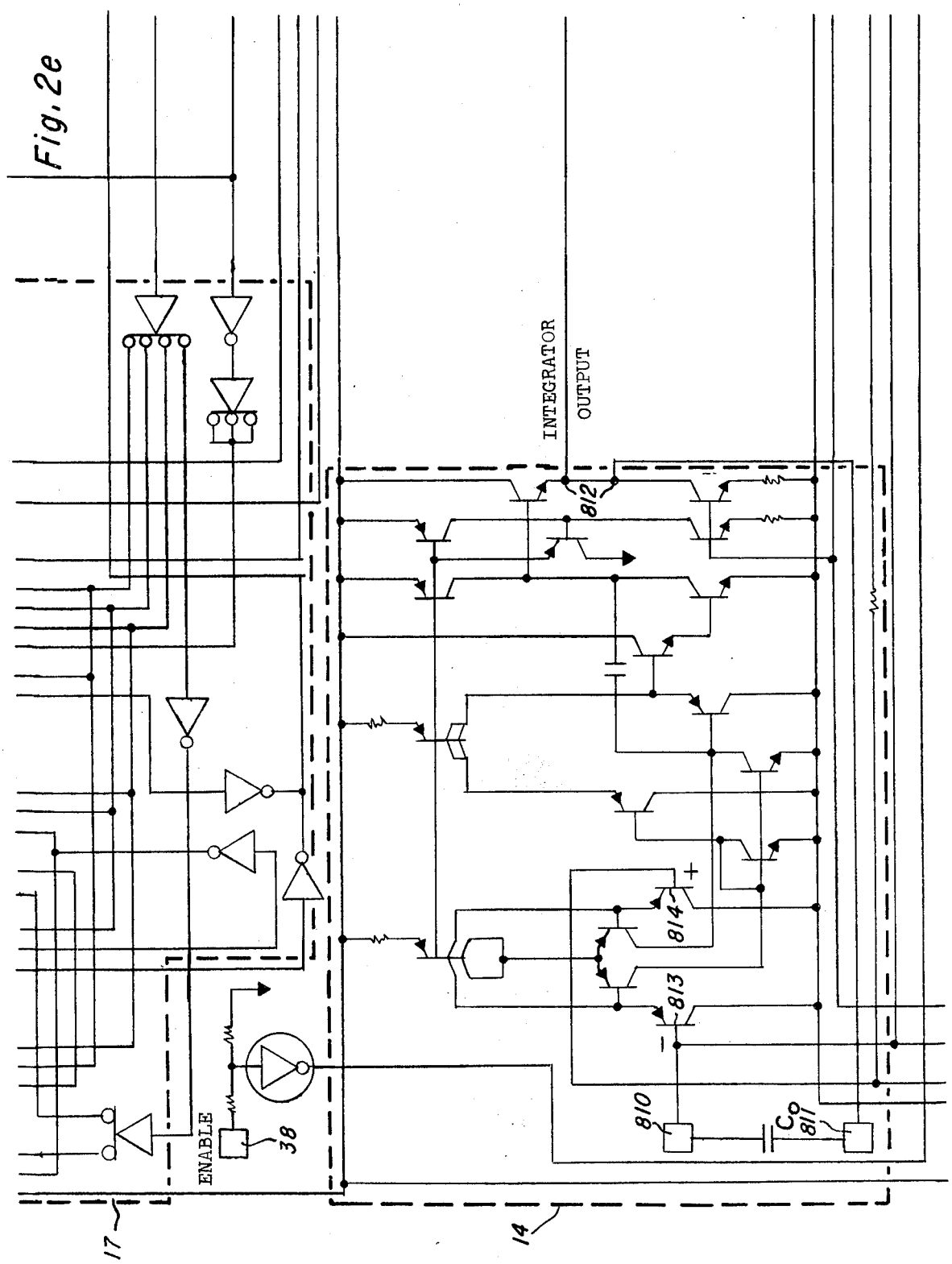

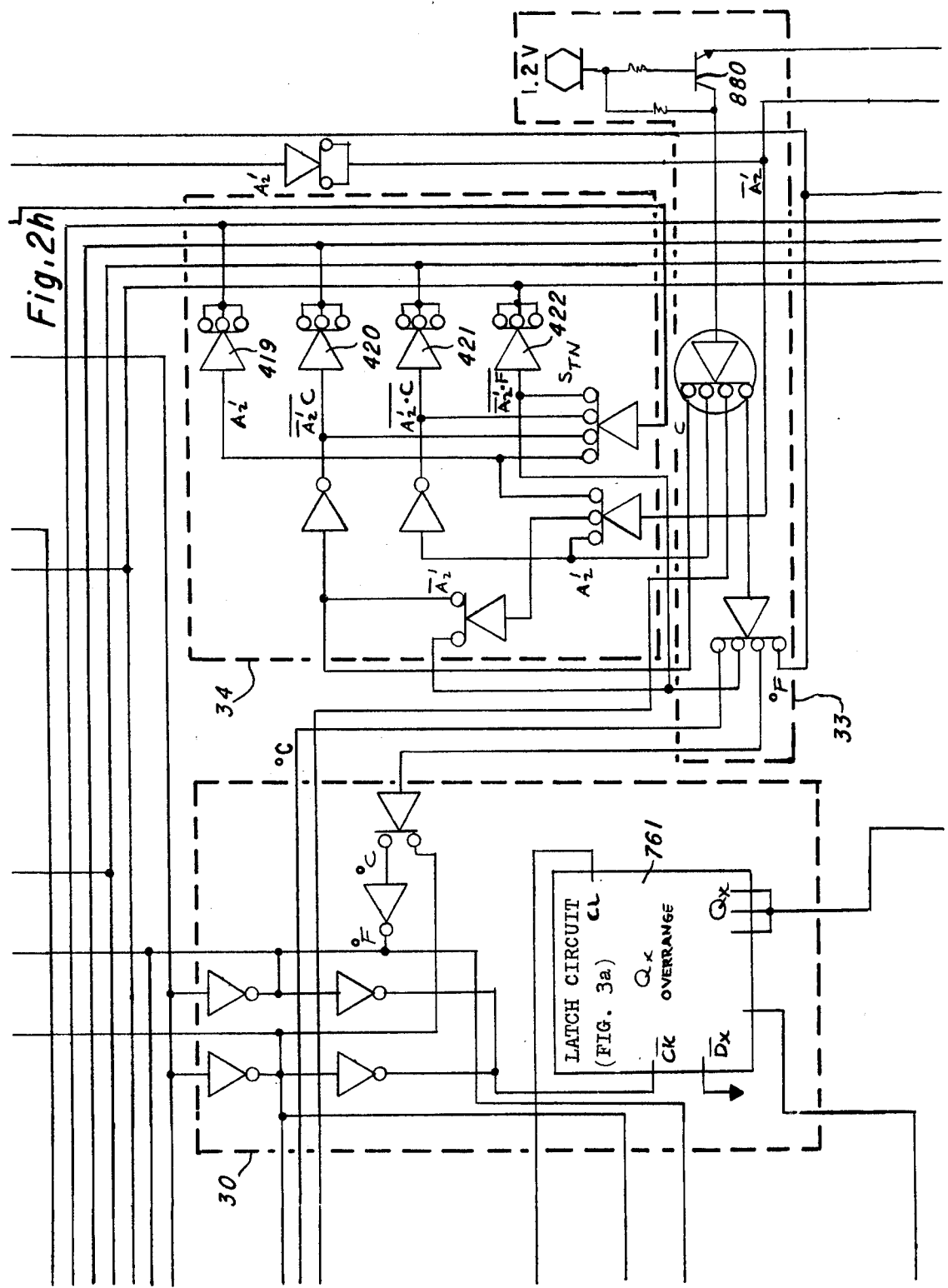

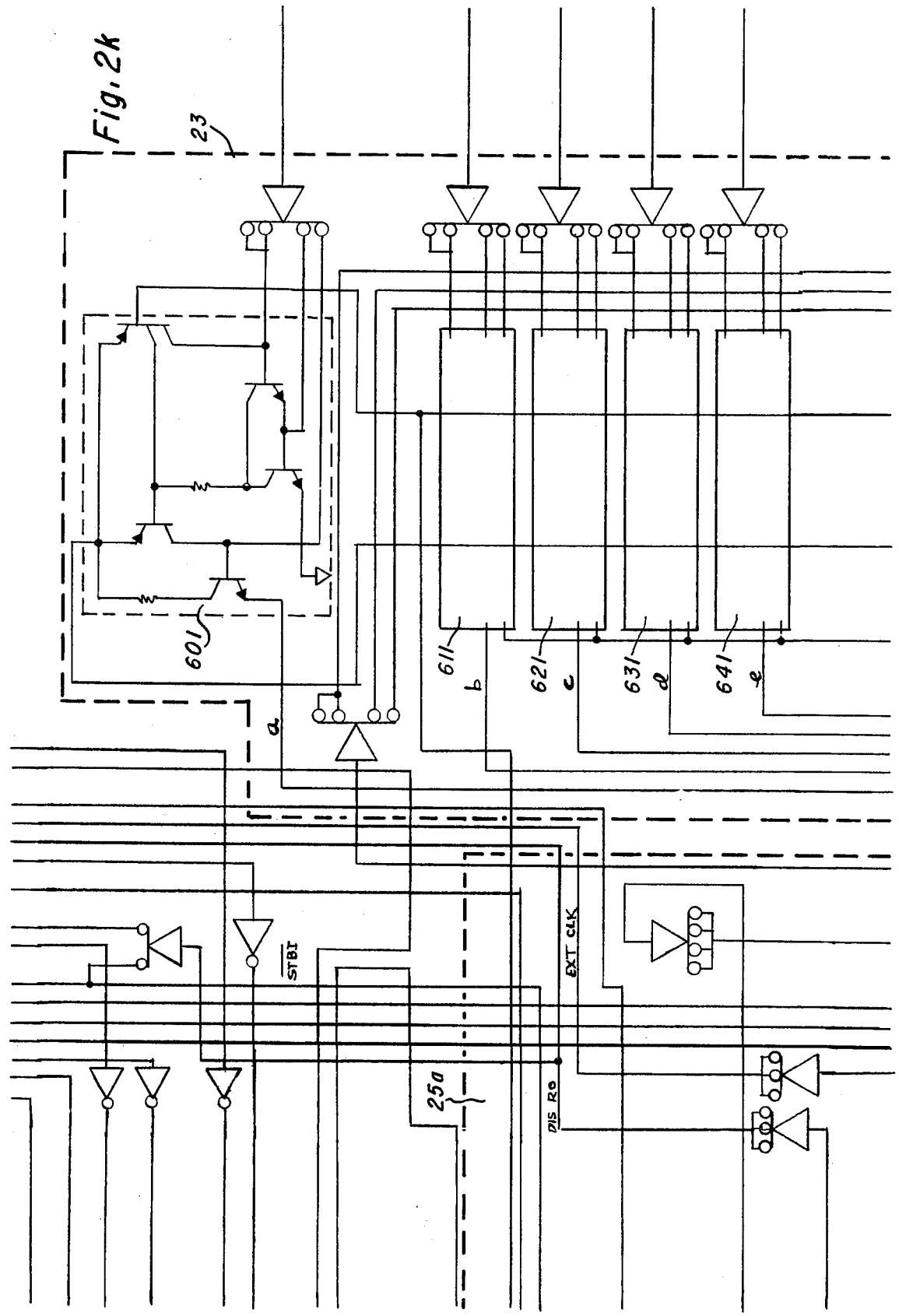

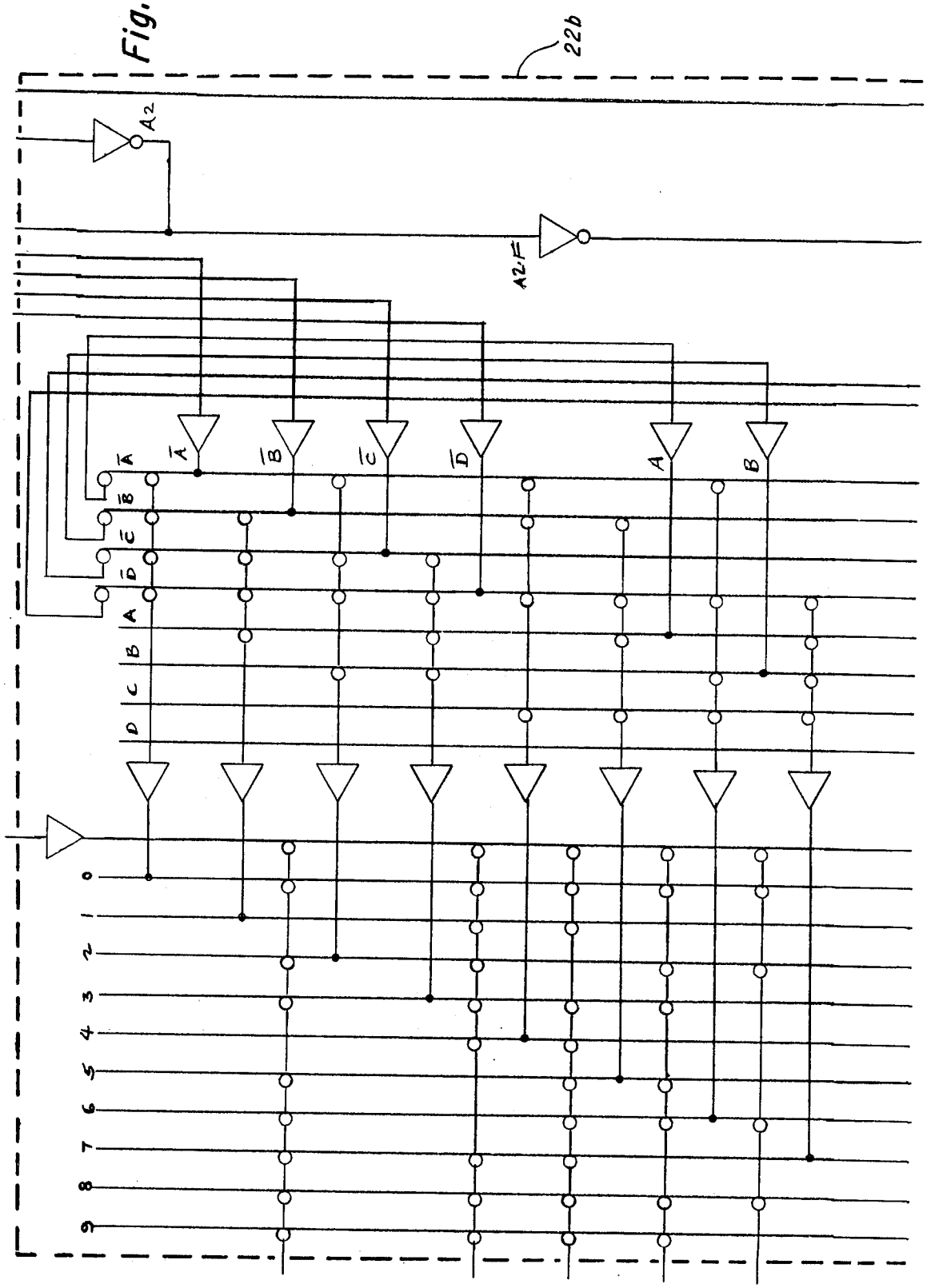

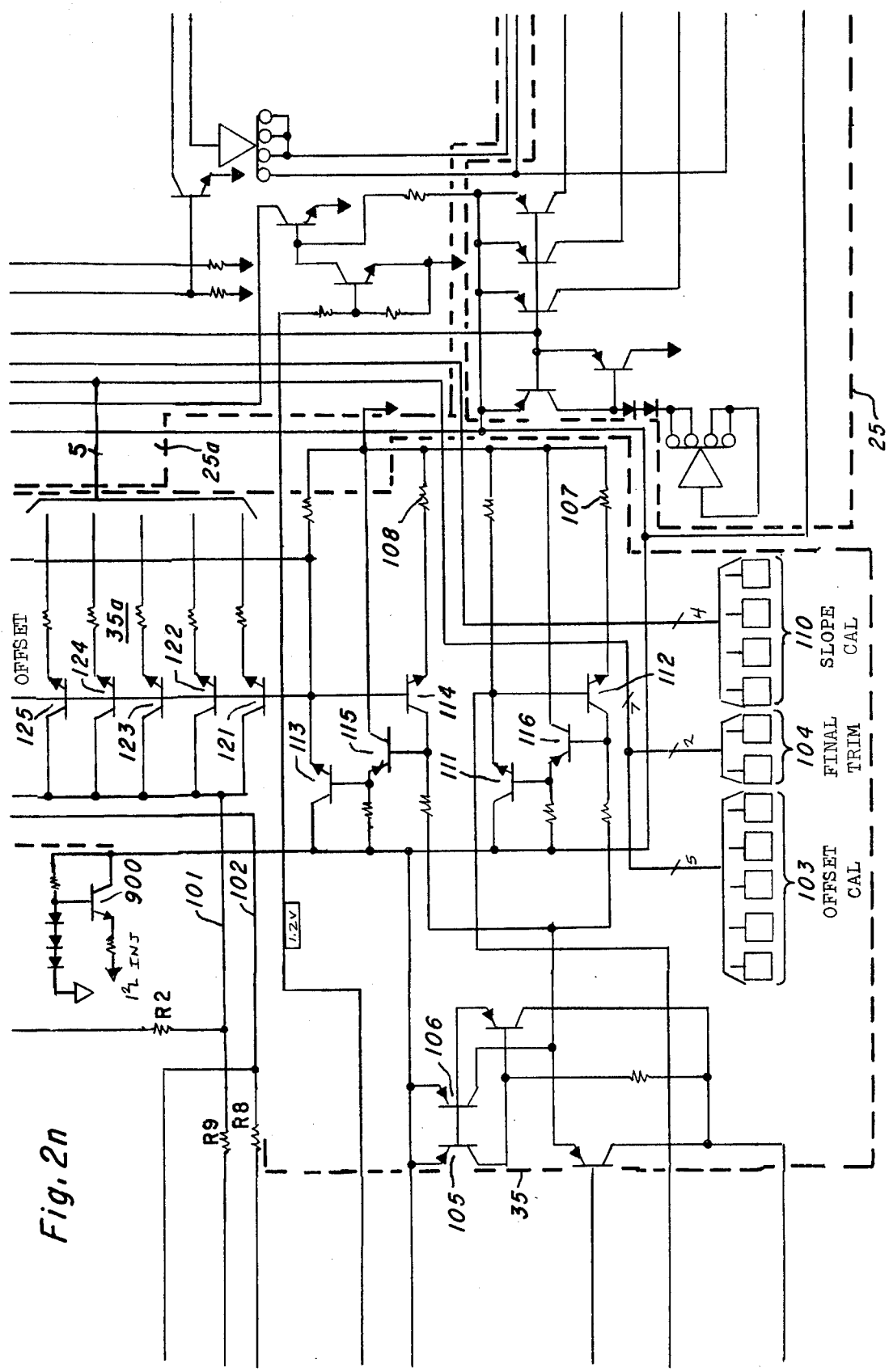

I²L RING OSCILLATOR AND METHOD OF FABRICATION

BACKGROUND OF THE INVENTION

This invention relates to oscillator circuits, and more particularly, to an I²L ring oscillator circuit with adjustable repetition rate.

Ring oscillator circuits are desirable because they may be fabricated as an integrated circuit, ordinarily as part of an integrated system, and do not require any external components. The ring oscillators are sufficiently accurate to provide digital clocking signals. However, the frequencies of ring oscillators of this type are not accurately predictable and variations in processing can greatly alter the repetition rate of the oscillator in any given system. Furthermore, since the entire oscillator is integrated, there is no means of adjusting the oscillator once fabricated. In certain instances, such as the use of the ring oscillator for a dual slope analog-to-digital converter or other system in which frequency accuracy and stability are important, prior art has been unable to utilize ring oscillators; instead, the more expensive adjustable oscillators with external components, such as variable resistors or capacitors, have been required.

It is, therefore, an object of the present invention to provide an improved I²L ring oscillator circuit.

Another object of the invention is to provide an accurate but inexpensive ring oscillator circuit which is capable of being integrated on a single semiconductor substrate with other I²L circuitry.

A further object of the invention is to provide an I²L ring oscillator circuit which includes means by which the frequency may be adjusted during or after fabrication is complete.

It is another object of the invention to provide a method of fabricating an I²L system including an I²L ring oscillator circuit which provides for the adjustment of the ring oscillator circuit to compensate for unpredictable variations in parameters caused by processing.

It is a further object of the invention to provide an I²L ring oscillator circuit for a dual slope analog-to-digital converter, both being integratable on a single substrate utilizing I²L techniques.

Yet another object of the invention is to provide an I²L ring oscillator circuit for a portable, battery-operable, digital thermometer.

Brief Description of the Invention

These and other objects are accomplished in accordance with the present invention in which an integrated I²L ring oscillator circuit includes means by which the repetition rate of the oscillator is adjustable over a desired range. A plurality ($m$) of cascaded I²L logic gates, such as NAND gates, are coupled in a ring configuration to achieve a plurality of astable states. Frequency adjustments are made by varying the amount of injection current applied to the logic gates which comprise the ring oscillator. Lowering injection current to the gates increases delay time from one astable state to the next, and therefore, results in a lower frequency repetition rate. In one embodiment of the circuit, an ($n+1$) collector I²L transistor is provided which receives current injection from a first injection current source. One collector of the I²L transistor is coupled, as a current sink, to a second injection current source; it is the second current source which provides injection current for the oscillator logic gates. The remaining $n$ collectors of the I²L transistor are selectively coupled in a feedback loop to the input (base) of the transistor. Where A is the gate injection current supplied by the first current source, the transistor will sink from $1/n \times A$ (with the $n$ collectors connected in the feedback connection) to A (with only one of the $n$ collectors connected in the feedback connection). In a further modification of the above embodiment, the second current source is comprised of a multi-collector transistor, the current supplied by the second current source being selectively taken from one or more of the collectors to further control the amount of injection current supplied by the second source equally to the logic gates of the ring oscillator.

Brief Description of the Drawings

Still further objects and advantages of the invention will be apparent from the detailed description and claims when read in conjunction with the accompanying drawings, wherein:

FIGS. 1a–1c, when assembled according to the composite of FIG. 1, embodying the present invention;

DETAILED DESCRIPTION OF THE PREFERRED EMBODIMENTS

Figure 1A:
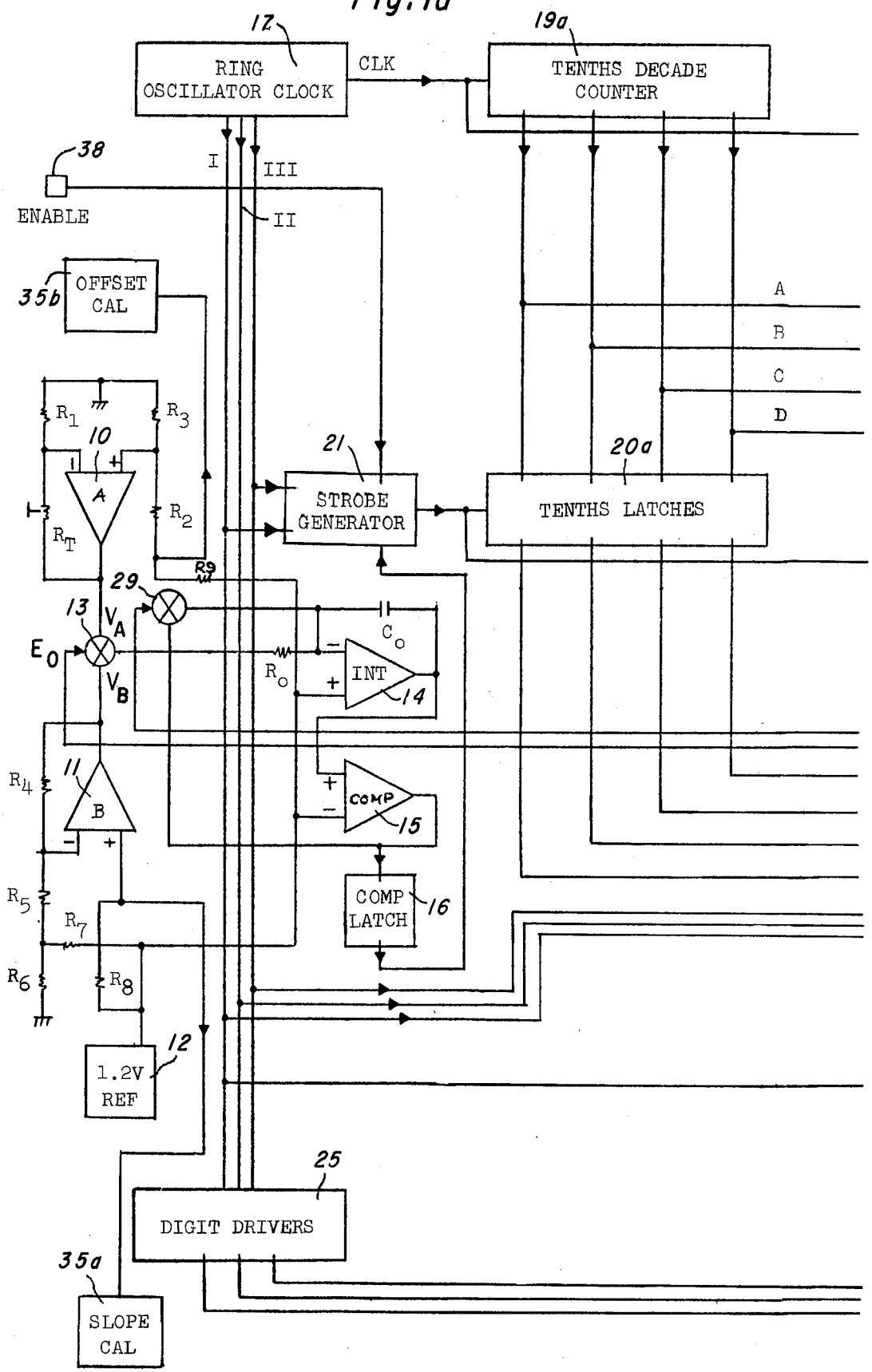
Figure 1B:
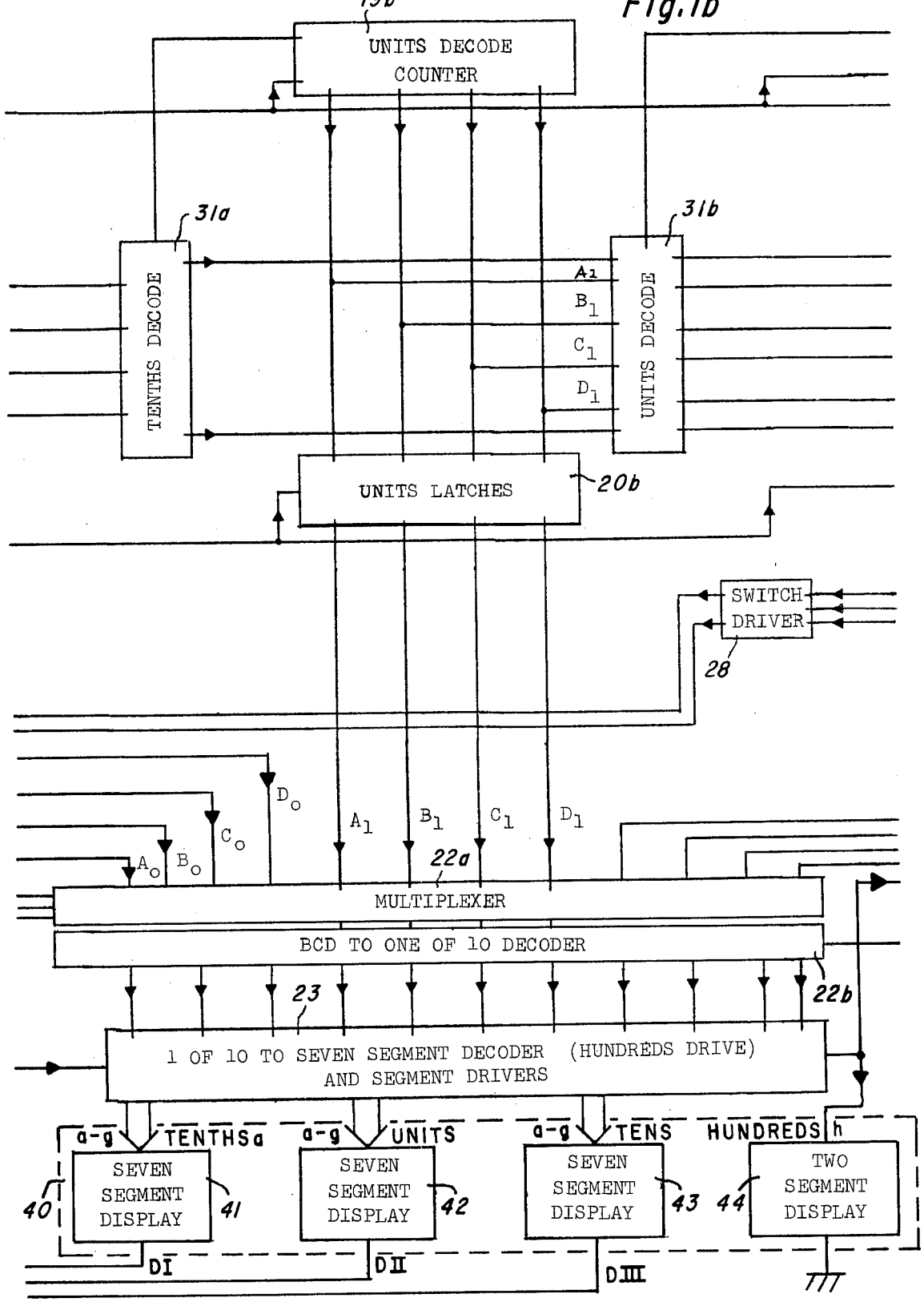

Referring then to the drawings, and in particular to FIGS. 1a–1c, a unique digital thermometer is illustrated in which the present invention is embodied and comprises a novel feature thereof. The digital thermometer is integrated on a single semiconductor substrate, utilizing I²L fabrication techniques, with the exception of a few external components; such as, a thermistor or other suitable temperature-sensitive device, LED or other suitable display elements, an integration capacitor and an analog input gain-setting resistor.

The digital thermometer is comprised of two sections; an analog section which measures and converts an analog signal representative of temperature to an appropriate digital signal and a digital section which stores, decodes and digitally displays the digital signal to provide a visible temperature reading.

The analog section is comprised of an analog-to-digital converter which utilizes dual slope integration. The analog-to-digital converter is able to reject unwanted components of signals such as 60-Hz pickup. A stable voltage reference $V_{REF}$ is provided to the analog-to-digital converter by voltage regulator 12, the output of which does not vary significantly under a wide range of conditions; such as, ambient temperature variations or variations in a battery voltage supply ($V_{CC}$). The voltage regulator 12, shown in greater detail in FIG. 2m, is described in detail and claimed in copending U.S. patent application, Ser. No. 737,134, for "Temperature-Compensated Voltage Regulator" by Stephen C. Kwan, filed on Oct. 29, 1976, and assigned to the assignee of the present invention. The reference voltage $V_{REF}$ (1.2 volts in this embodiment) is coupled to the positive (+)

input of scaling operational amplifier 10 and reference operational amplifier 11.

The temperature is sensed by thermistor $R_T$ (which, in other embodiments, may be substituted for by light-sensitive devices; such as, photo resistors for light level measurement, or transducer devices for measurement of mechanical stress; such as, pressure or tension) which is coupled between the $V_A$ output of scaling operational amplifier 10 and the negative (−) input of amplifier 10.

Scaling amplifier 10 produces voltage $V_A$ which varies according to the temperature or other parameter being measured. Reference amplifier 11 has a constant resistance internal resistor R4 coupled between its output and its negative (−) input to provide voltage $V_B$ representing the full-scale value of the parameter being measured. Amplifiers 10 and 11 are illustrated in detail in the circuit diagram of FIG. 2i. Referring then to FIG. 2i, the base of transistor 343 provides the positive (+) input and the base of transistor 344 provides the negative (−) input of scaling amplifier 10; the base of transistor 345 provides the positive (+) input and the base of transistor 346 provides the negative (−) input of reference amplifier 11. Transistors 349 and 350, in essence, provide the output of amplifiers 10 and 11, respectively, to switch 13. Analog switch 13 allows either voltage $V_A$ output from amplifier 10 or voltage $V_B$ output from amplifier 11 to be applied by means of transistor 351 and resistor $R_O$ of the negative (−) input of integrator 14. Switch 13, shown in FIG. 2j, is selectively enabled by switch driver 28 and operates to ground the collectors of either transistor 349 or transistor 350. The output of the amplifier with the non-ground transistor will be transferred to integrator 14. Switch driver 28, which is comprised of NAND gates 352 and 353, receives selection signals $E_O$ from three-state counter 26 via one-of-three decoder 27.

Integrator 14, which is illustrated in detail in FIG. 2e, produces a ramp voltage in one direction (e.g., positive) when the voltage $V_A$ is applied via resistor $R_O$ to the negative (−) input and produces a ramp voltage in the opposite (e.g., negative) direction when the voltage $V_B$ is applied via resistor $R_O$ to the negative (−) input. An integration capacitor $C_O$ is connected between output 812 of integrator 14 (at terminal 811) and its negative (−) input (at terminal 810) provided by the base of transistor 813. The base of transistor 814 provides the positive (+) input of integrator 14. The output 812 of integrator 14 is coupled to the positive (+) input provided by the base of transistor 151 of analog comparator 15 shown in detail in FIG. 2f.

The negative (−) input of comparator 15, provided by the base of transistor 153, is coupled to receive $V_{REF}$. Comparator 15 produces a logical transition at output 154 when the input signal at the base of transistor 151 crosses the threshold is either direction (positive to negative to positive). Detection of this transition by isolated (non-current injected) NAND gate 156 trips comparator latch 16 which stores the information that the transition has occurred. Comparator latch 16 is comprised of cross-coupled NAND gates 785 and 786.

The output of comparator 15 is selectively fed back to the negative (−) input of integrator 14 by means of switch 29. Switch 29, illustrated in detail in FIG. 2j, is enabled by NAND gates 354 of switch driver 28 in a similar manner to switch 13 in order to discharge capacitor $C_O$ at the appropriate time during each analog-to-digital conversion cycle.

Input signal scaling of the analog-to-digital converter is provided through selection in input resistors RT and $R_1'$-$R_9$. RT is the external thermistor or other condition-sensing device coupled between terminals 347 and 348. $R_1$ is an external analog input gain-setting resistor coupled between terminal 347 and ground; the remaining resistors $R_2$-$R_9$ may be and are preferably integrated on the semiconductor substrate to avoid excessive external components.

The digital section of the digital thermometer is comprised of current injection logic (I²L) which operates from the same voltage supply as the analog section described above. All of the gates (represented by triangles in FIG. 2a-2p) are NAND gates; the collector outputs (represented by circles at the point of the triangles) are shown for each gate.

Figure 2A:
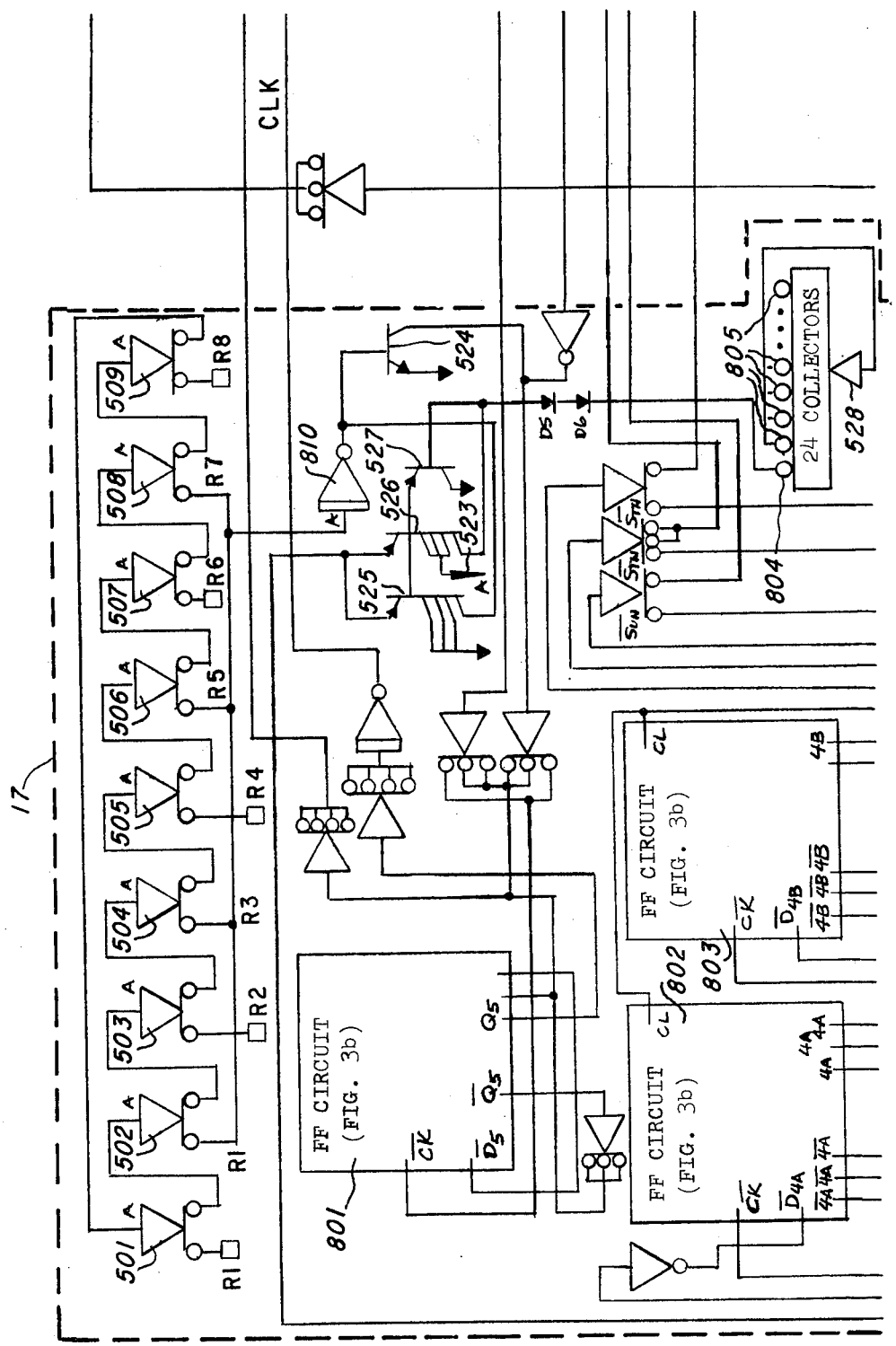
FIGS. 2a–2p, when assembled according to the composite of FIG. 2, form a detailed circuit diagram of the digital thermometer of FIGS. 1a–1c.

The digital section includes a ring oscillator 17 which produces clock pulses (CLK) for the system and three scanning signals (I, II and III) and is shown in detail in FIGS. 2a and 2e.

Referring then to FIGS. 2a and 2e, ring oscillator 17 is comprised of a plurality of cascaded NAND gates 501-509 coupled in a ring configuration to achieve a plurality as astable states. Thus, the output of each of the gates 501-508 is respectively connected to the input of the next gate 502-509 in the cascade and the output of gate 509 is coupled to the input of the gate 501 to complete the ring configuration. The system clock which typically runs at 20 kHz, is taken from the outputs of NAND gates $R_1$, $R_3$, $R_5$ and $R_7$ which are NAND'd by NAND gate 810 according to the equation $CK = R_1 \cdot R_3 \cdot R_5 \cdot R_7$. The output of NAND gate 810 is applied to the base of driver transistor 524 and by the collecter of transistor 524 to flip-flop circuit 801. Flip-flop circuit 801 provides the clock signal for the rest of the digital circuitry.

A unique feature of oscillator circuit 17 is that provision is made for frequency adjustments by lead pattern selection in the fabrication process to provide discrete variations in oscillator injector current levels. Lowering injector currents increases delay time between each of the astable states provided by NAND gate 501-509, and, therefore, results in a lower clock frequency. In the illustrated embodiment, seventy-two discrete adjustments in frequency are available. The ranges are: MAX $I_{LOW\,INJ} = 3/12\ I_{HIGH\,INJ}$; MIN $I_{LOW\,INJ} = 1/24 \times 1/13\ I_{HIGH\,INJ}$ (i.e., 3 MAX to 1/24 MIN) where: $I_{HIGH\,INJ}$ is the injector current of the I²L gates in the rest of the digital circuitry of the system, and $I_{LOW\,INJ}$ is the injector current of the I²L gates in the ring oscillator chain. These adjustments can best be understood from the following description of the current biasing utilized in the digital thermometer. I²L gate 528 is comprised of a 25-collector transistor connected as a current sink. The injector of transistor 528 is biased from the main system current injector 900 (shown in FIG. 2n), which provides, for example, 10 μA per gate. Collector 804 is utilized to sink current and the other 24 collectors 805 are selectively utilized in the feedback connection to the input of gate 528. The single sink collector 804 will sink from 1/24th of the 10 μA (with all collectors 805 connected in the feedback) to 10 μA (with only one collector 805 connected in the feedback).

The parallel connection of transistors 525 and 526 provides eight collectors, each biased at 1/24th of 10 μA to 10 μA. Transistor 527, a high-gain substrate PNP, is utilized to compensate for the low-gain of transistors 525 and 526 by providing a path for their base current to ground.

In the illustrated embodiment, three of the eight collectors of transistor 526 are coupled together at 523 to provide drive current A to drive the injectors of the nine I²L gates 501–509 comprising the ring oscillator and NAND gate 810. Thus, the injector current, realized by gate 528, undergoes division by 24, multiplication by 3 and division by 10; this is the current at which ring oscillator gates 501–509 are biased. The factors 24 and 3 are adjustable in integral steps making a division ratio of 1/24 to 3 possible by selective connection in the fabrication process of the collectors of transistors 525, 526 and 527, as required.

In the digital thermometer, adjustable oscillator frequency is important to optimize the circuit for maximum sensitivity and accuracy and for compensation of the circuit for inaccuracies in device parameters which are process dependent, and not completely and accurately calculable, and thus, not under direct control. This technique, along with its obvious modifications, namely, varying the number of collectors on both the transistor of gate 528 and parallel transistors 525 and 526, is considered broader in application than the digital thermometer; it is applicable to all circuits which utilize an I²L ring oscillator that is integrated on the same substrate as other I²L circuitry, the oscillator being of low cost and yet adjustable within a high degree of accuracy.

Figure 2B:
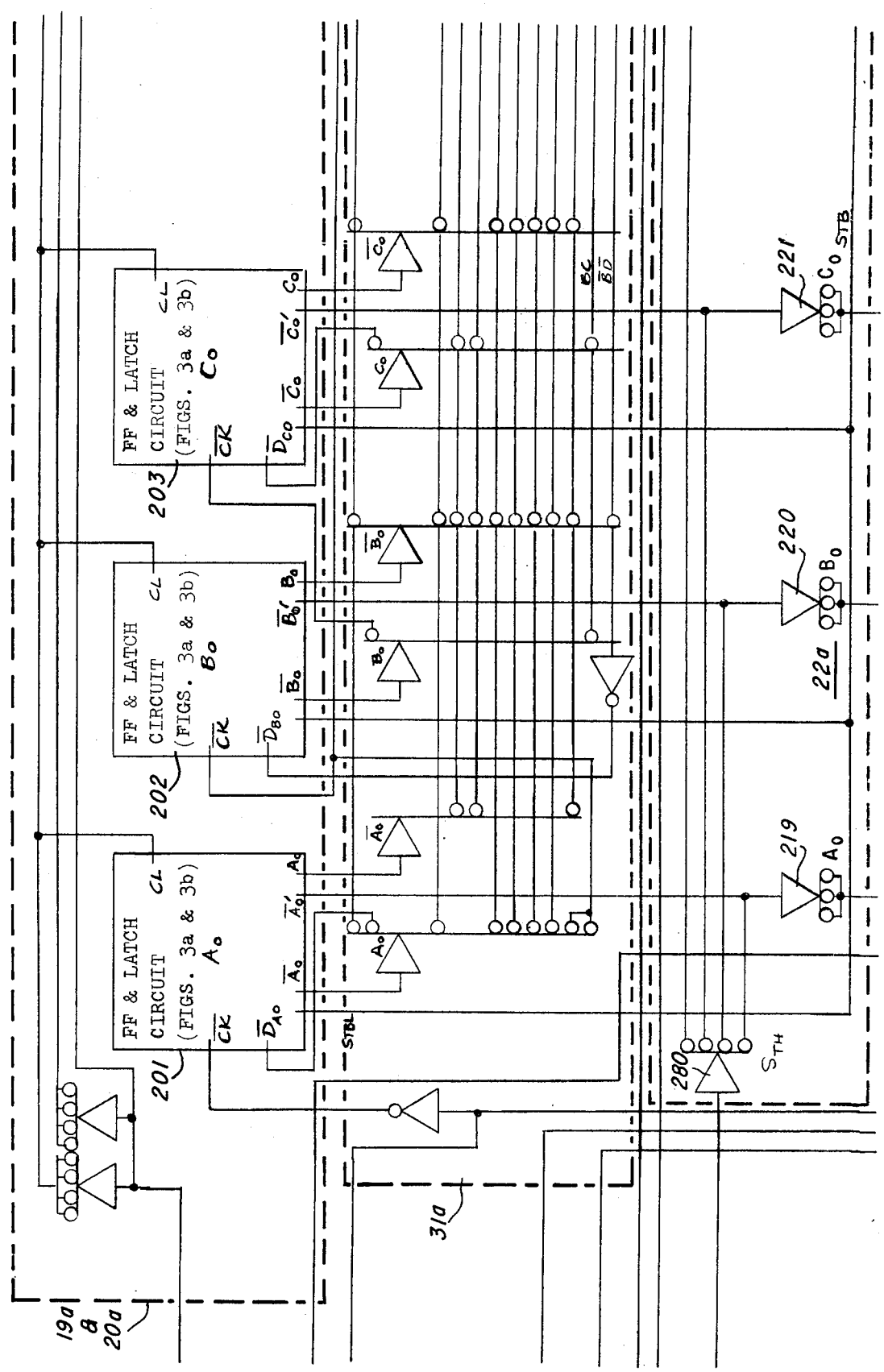
Figure 2C:
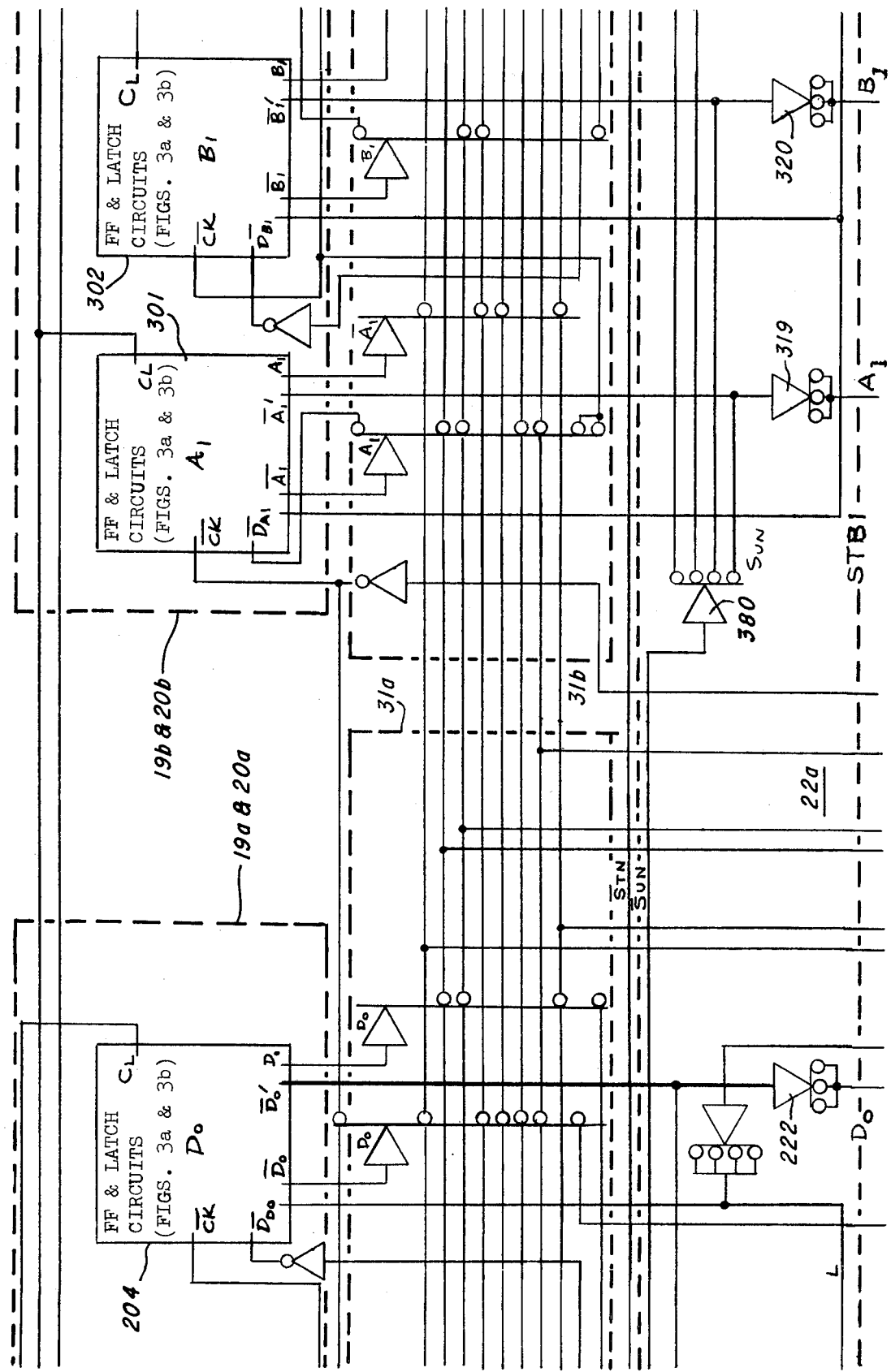

In the embodiment of the ring oscillator illustrated in FIGS. 2a and 2e, the clock signal rate is reduced to about 2 kHz by flip-flops 201–204 comprising tenths decode counter 19a, shown in FIGS. 2b and 2c. The output of $D_O$ counter flip-flop 204 is input to flip-flops 802 and 803 of oscillator circuit 17 to provide display multiplexing signals I, II and III which are applied to display multiplexer circuit 22a and digit drivers 25.

Figure 4:
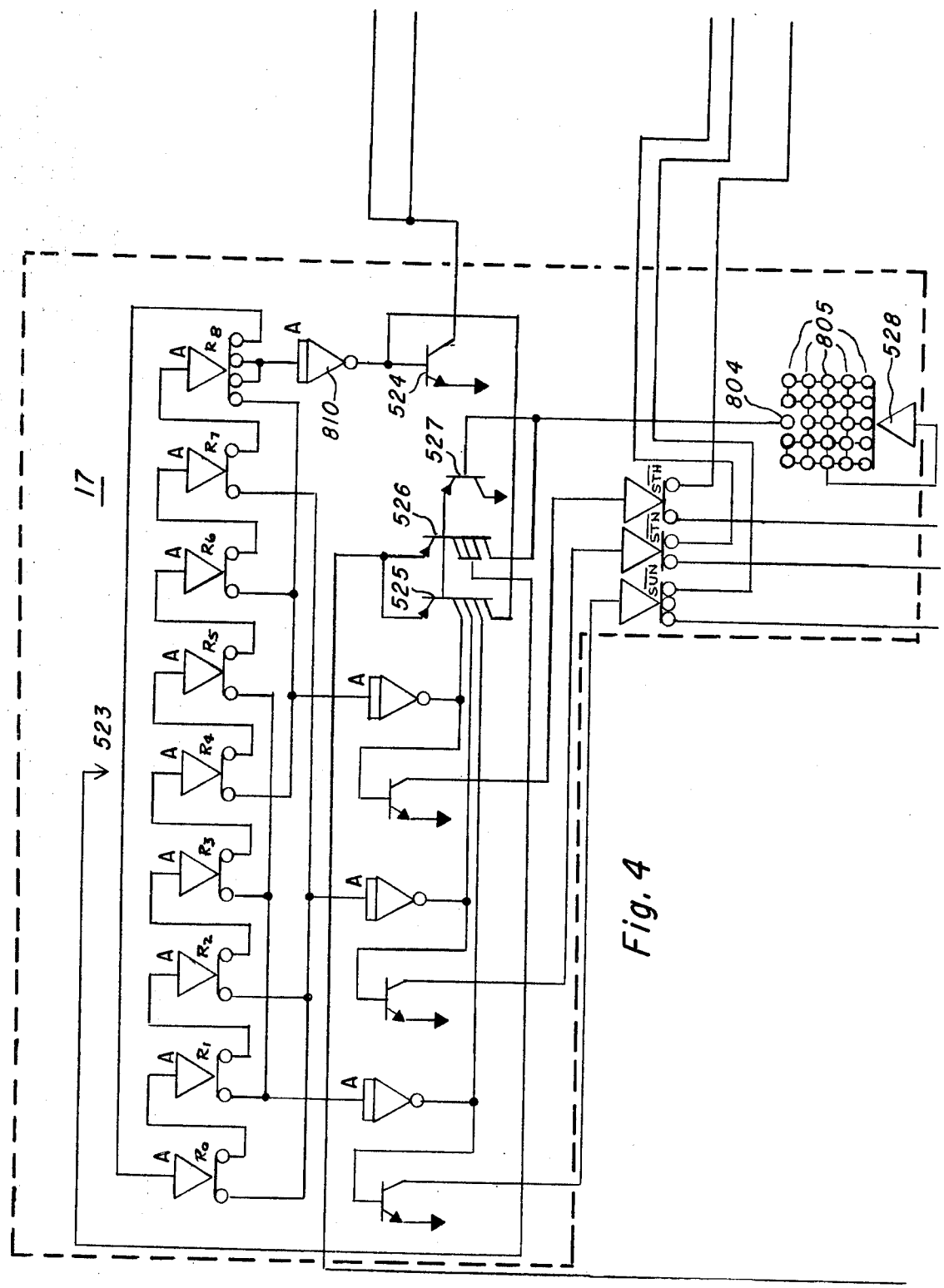
FIG. 4 is a circuit diagram of an alternate embodiment of the oscillator utilized in the analog-to-digital converter of the digital thermometer.

In an alternate embodiment, the multiplexing signals I, II and III are derived directly from the ring counter along with the system clock signal as illustrated in FIG. 4. The resulting circuit operates as indicated in Table 1 below. The system clock signal is taken from $R_8$, the output of gate 509, which provides a 50% duty cycle. Scan outputs I, II and III, for three-phase scanning, are derived as follows: I = $R_1 \cdot R_3 \cdot R_5$; II = $R_2 \cdot R_4 \cdot R_6$ and III = $R_0 \cdot R_2 \cdot R_7$.

TABLE I

| STATE | RING OSCILLATOR OUTPUTS | | | | | | | | | SCANNING SIGNALS | | |
|---|---|---|---|---|---|---|---|---|---|---|---|---|
| | $R_0$ | $R_1$ | $R_2$ | $R_3$ | $R_4$ | $R_5$ | $R_6$ | $R_7$ | $R_8$ | $R_0$ | I | II | III |
| 0 | 0 | 1 | 0 | 1 | 0 | 1 | 0 | 1 | 0 | 0 | 0 | 1 | 1 |
| 1 | 1 | 1 | 0 | 1 | 0 | 1 | 0 | 1 | 0 | 1 | 0 | 1 | 1 |
| 2 | 1 | 0 | 0 | 1 | 0 | 1 | 0 | 1 | 0 | 1 | 1 | 1 | 1 |
| 3 | 1 | 0 | 1 | 1 | 0 | 1 | 0 | 1 | 0 | 1 | 1 | 1 | 0 |
| 4 | 1 | 0 | 1 | 0 | 0 | 1 | 0 | 1 | 0 | 1 | 1 | 1 | 0 |
| 5 | 1 | 0 | 1 | 0 | 1 | 1 | 0 | 1 | 0 | 1 | 1 | 1 | 0 |
| 6 | 1 | 0 | 1 | 0 | 1 | 0 | 0 | 1 | 0 | 1 | 1 | 1 | 0 |
| 7 | 1 | 0 | 1 | 0 | 1 | 0 | 1 | 1 | 0 | 1 | 1 | 1 | 0 |
| 8 | 1 | 0 | 1 | 0 | 1 | 0 | 1 | 0 | 0 | 1 | 1 | 1 | 1 |
| 9 | 1 | 0 | 1 | 0 | 1 | 0 | 1 | 0 | 1 | 1 | 1 | 0 | 1 |
| 10 | 0 | 0 | 1 | 0 | 1 | 0 | 1 | 0 | 1 | 0 | 1 | 0 | 1 |
| 11 | 0 | 1 | 1 | 0 | 1 | 0 | 1 | 0 | 1 | 0 | 1 | 0 | 1 |
| 12 | 0 | 1 | 0 | 0 | 1 | 0 | 1 | 0 | 1 | 0 | 1 | 0 | 1 |
| 13 | 0 | 1 | 0 | 1 | 1 | 0 | 1 | 0 | 1 | 0 | 1 | 0 | 1 |
| 14 | 0 | 1 | 0 | 1 | 0 | 0 | 1 | 0 | 1 | 0 | 1 | 1 | 1 |
| 15 | 0 | 1 | 0 | 1 | 0 | 1 | 1 | 0 | 1 | 0 | 0 | 1 | 1 |
| 16 | 0 | 1 | 0 | 1 | 0 | 1 | 0 | 0 | 1 | 0 | 0 | 1 | 1 |
| 17 | 0 | 1 | 0 | 1 | 0 | 1 | 0 | 1 | 1 | 0 | 0 | 1 | 1 |

TABLE I-continued

| STATE | RING OSCILLATOR OUTPUTS | | | | | | | | | SCANNING SIGNALS | | |
|---|---|---|---|---|---|---|---|---|---|---|---|---|
| | $R_0$ | $R_1$ | $R_2$ | $R_3$ | $R_4$ | $R_5$ | $R_6$ | $R_7$ | $R_8$ | $R_0$ | I | II | III |
| 0 | 0 | 1 | 0 | 1 | 0 | 1 | 0 | 1 | 0 | 0 | 0 | 1 | 1 |

Dead time during states 2, 8 and 14 prevents "ghosting" of the display elements caused by overlapping digit multiplexing signals. The advantage of this embodiment is that the flip-flops 801–803 are eliminated and reduce the total surface area required for the oscillator circuit.

Ring oscillator 17 is coupled to a binary-coded-decimal counter having two-and-a-half stages, tenths-decade counter 19a, units-decade counter 19b and tens counter (flip-flop) 19c. The decade counters provide two functions: first, the counters are decoded at various stages to provide system timing, and second, the counters generate the digital equivalent of the sensor parameter value which, in the embodiment of the digital thermometer, is the digital equivalent of the temperature sensed by thermistor $R_T$.

As previously discussed, comparator 15 produces a logical transition when the signal applied to the positive (+) input terminal thereof crosses the threshold voltage in either direction. Each time the transition occurs, comparator latch 16 is tripped, thereby storing the information that the transition has occurred. The output of comparator latch 16 is coupled to strobe generator 21. Strobe generator 21, illustrated in detail in FIG. 2f, also receives scanning signals I and II, and operates to strobe latches 20a–20c at the appropriate time to store the results of a present conversion from counters 19a–19c, respectively. The results of the conversion, stored in latches 20a–20c, is then decoded and displayed while the analog-to-digital converter portion of the system proceeds to make the next conversion. The unique counting scheme utilized in accordance with a novel feature of the digital thermometer, will now be described in detail.

Figure 2D:
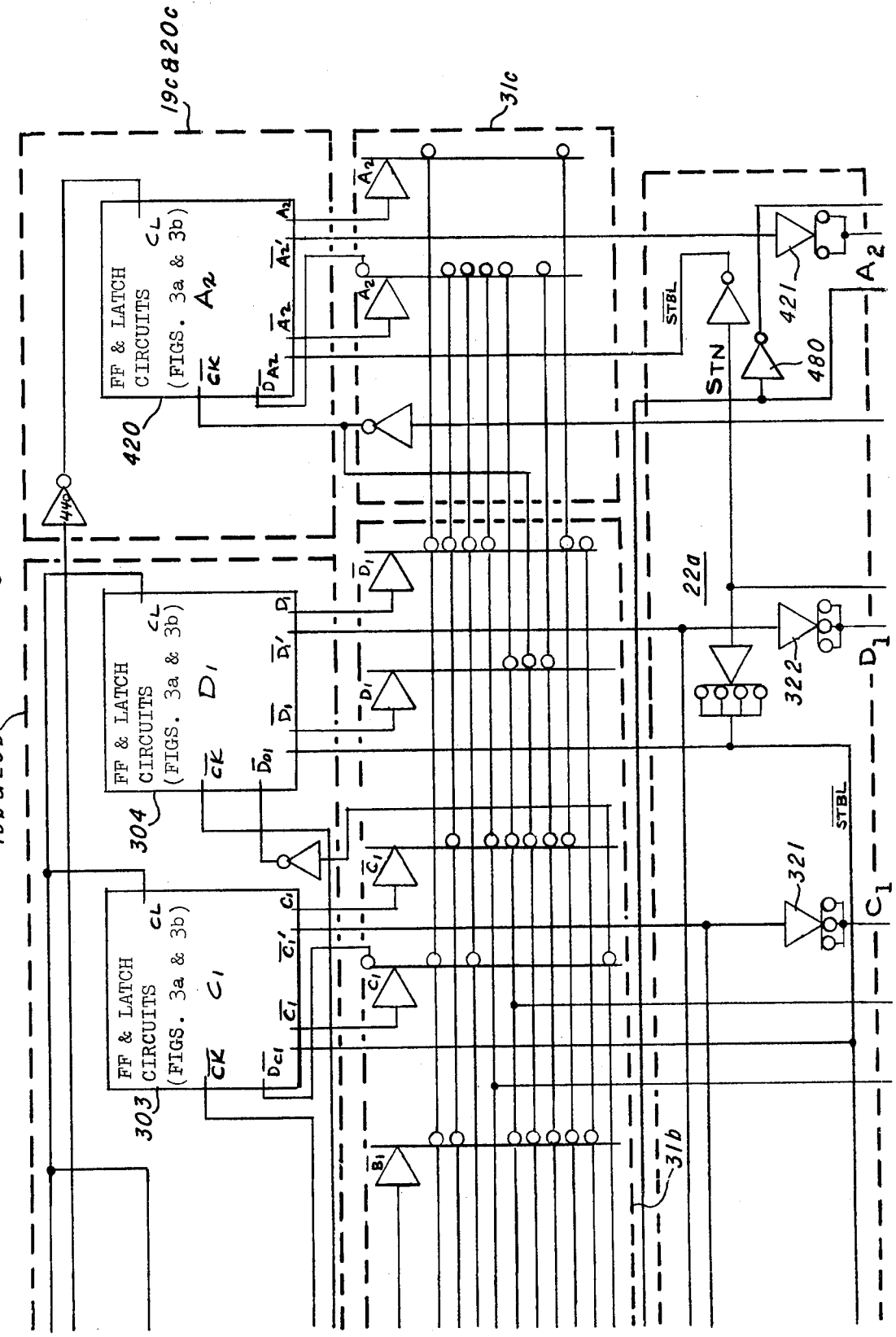
Figure 2F:
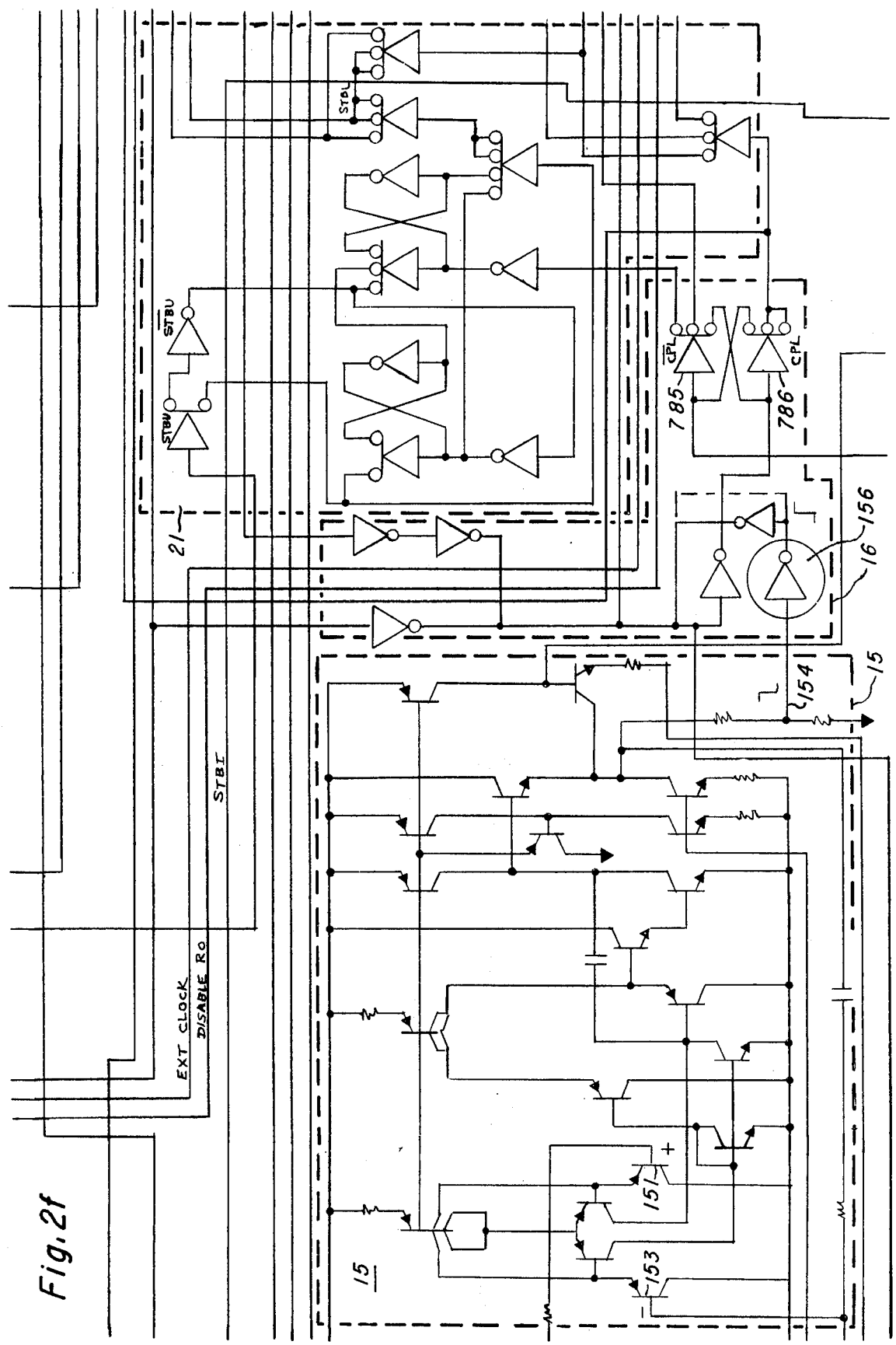
Figure 3B:
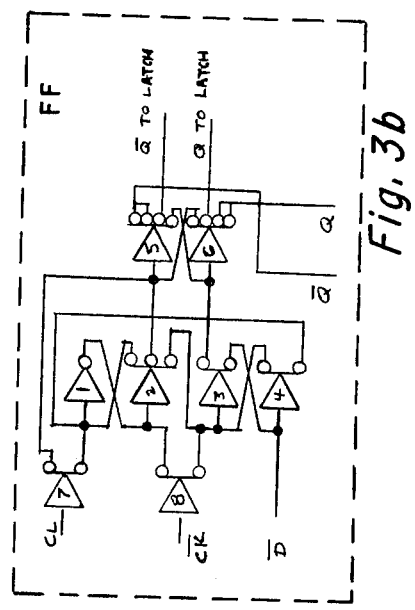
FIG. 3b is a circuit diagram of the flip-flop circuits of FIGS. 2a–2p.
Figure 3A:
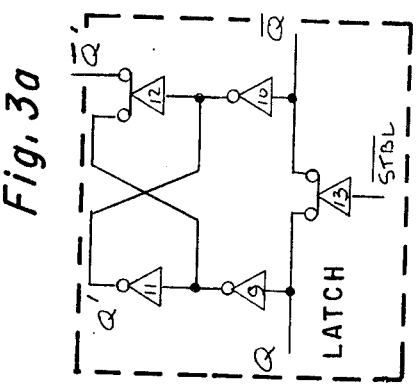
FIG. 3a is a circuit diagram of the latch circuits of FIGS. 2a–2p.

Tenths decade counter 19a is comprised of flip-flop circuits 201–204, units decade counter 19b is comprised of flip-flop circuits 301–304 and tens counter 19c is comprised of flip-flop circuit 203, each of the flip-flop circuits being identical to the flip-flop circuit of FIG. 3b. The output $A_0B_0C_0D_0$ of tenths counter 19a is decoded by means of tenths decode circuit 31a, shown in detail in FIGS. 2b and 2c; the output $A_1B_1C_1D_1$ of units decade counter 19b is decoded by units decode circuit 31b, shown in detail in FIGS. 2c and 2d; and, the output A2 of tens counter (flip-flop) 19c, is decoded by tens decode circuit 21c, shown in detail in FIG. 2d.

Figure 2G:
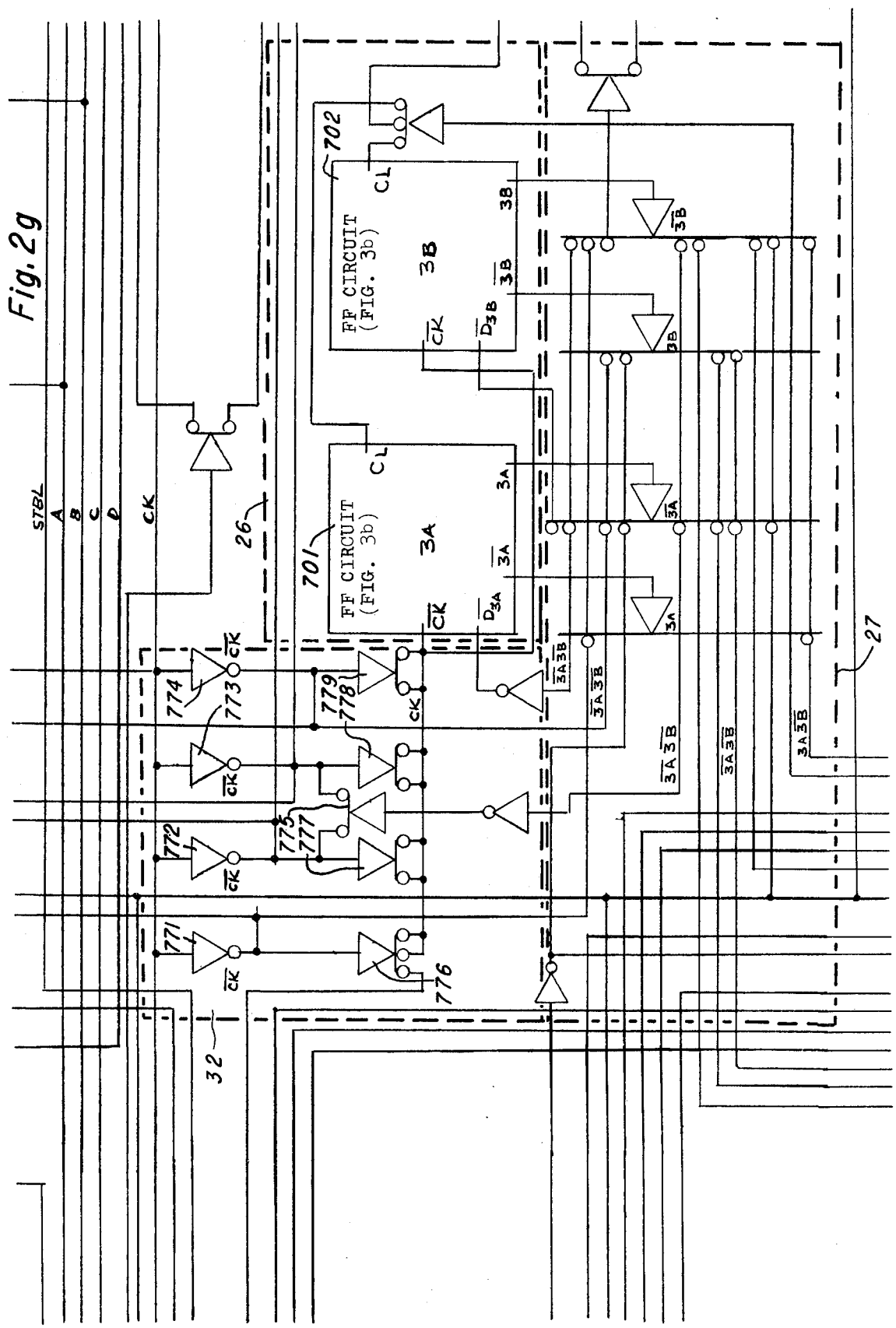
Figure 2I:
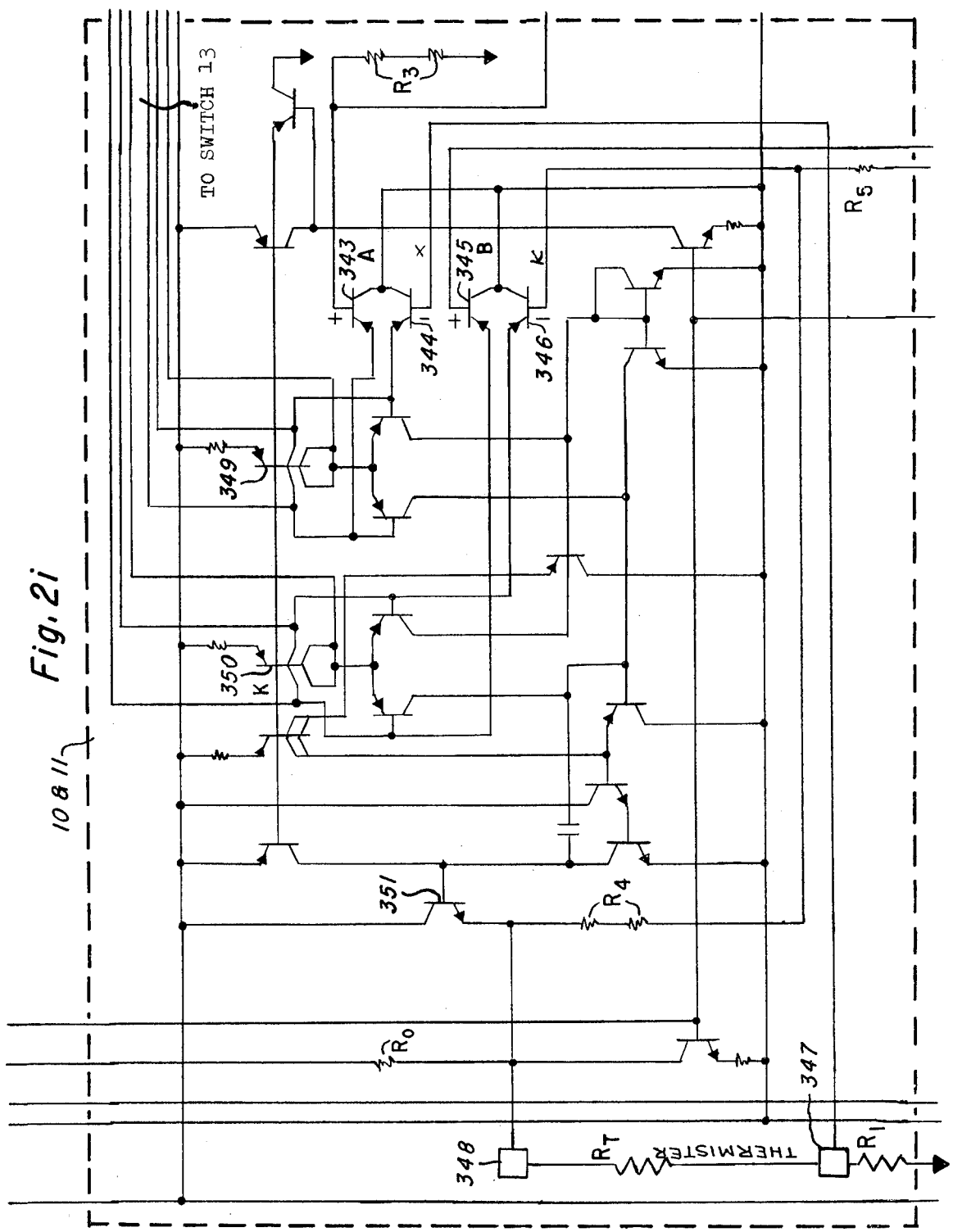
Figure 2J:
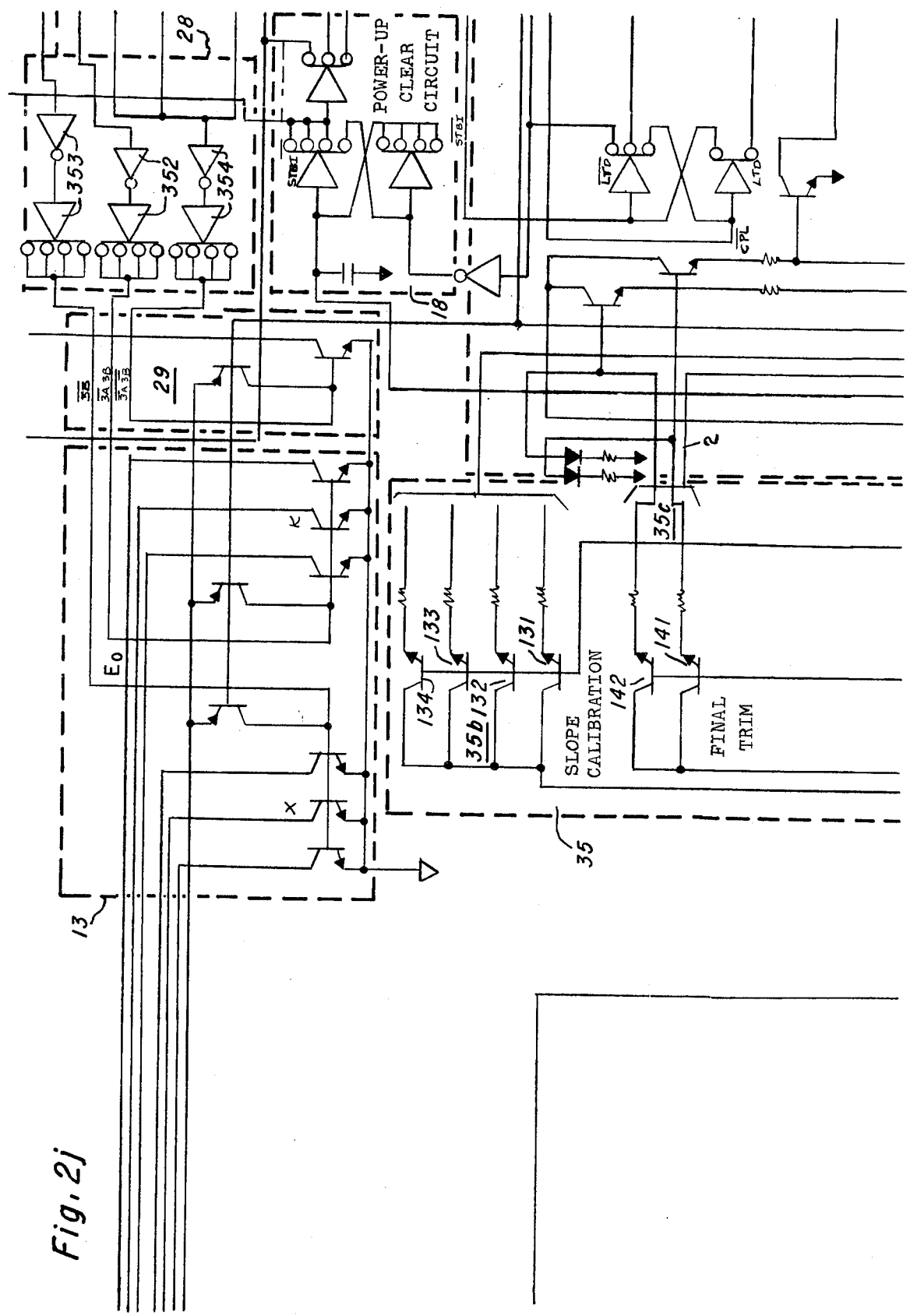
Figure 2M:
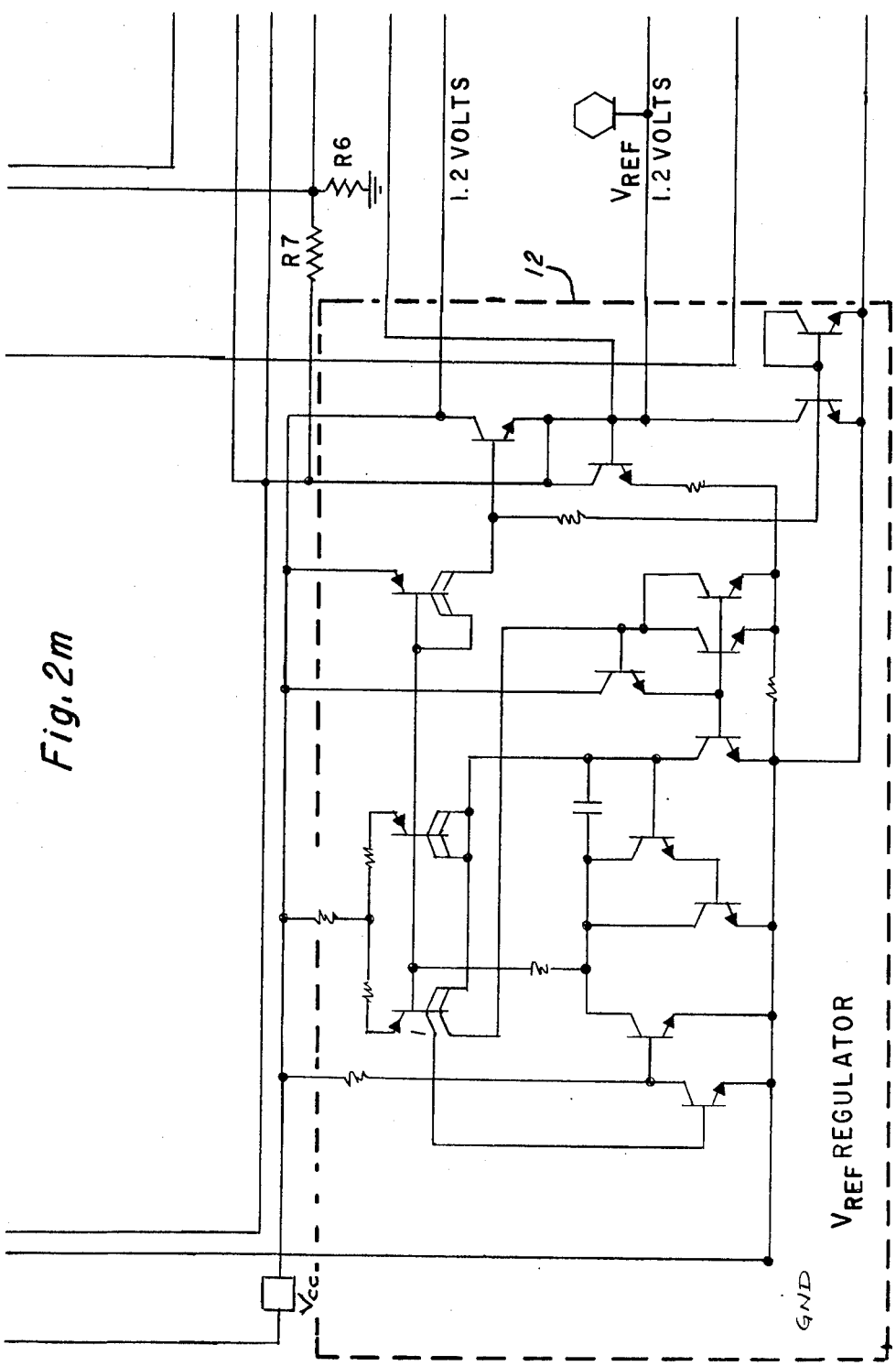
Figure 20:
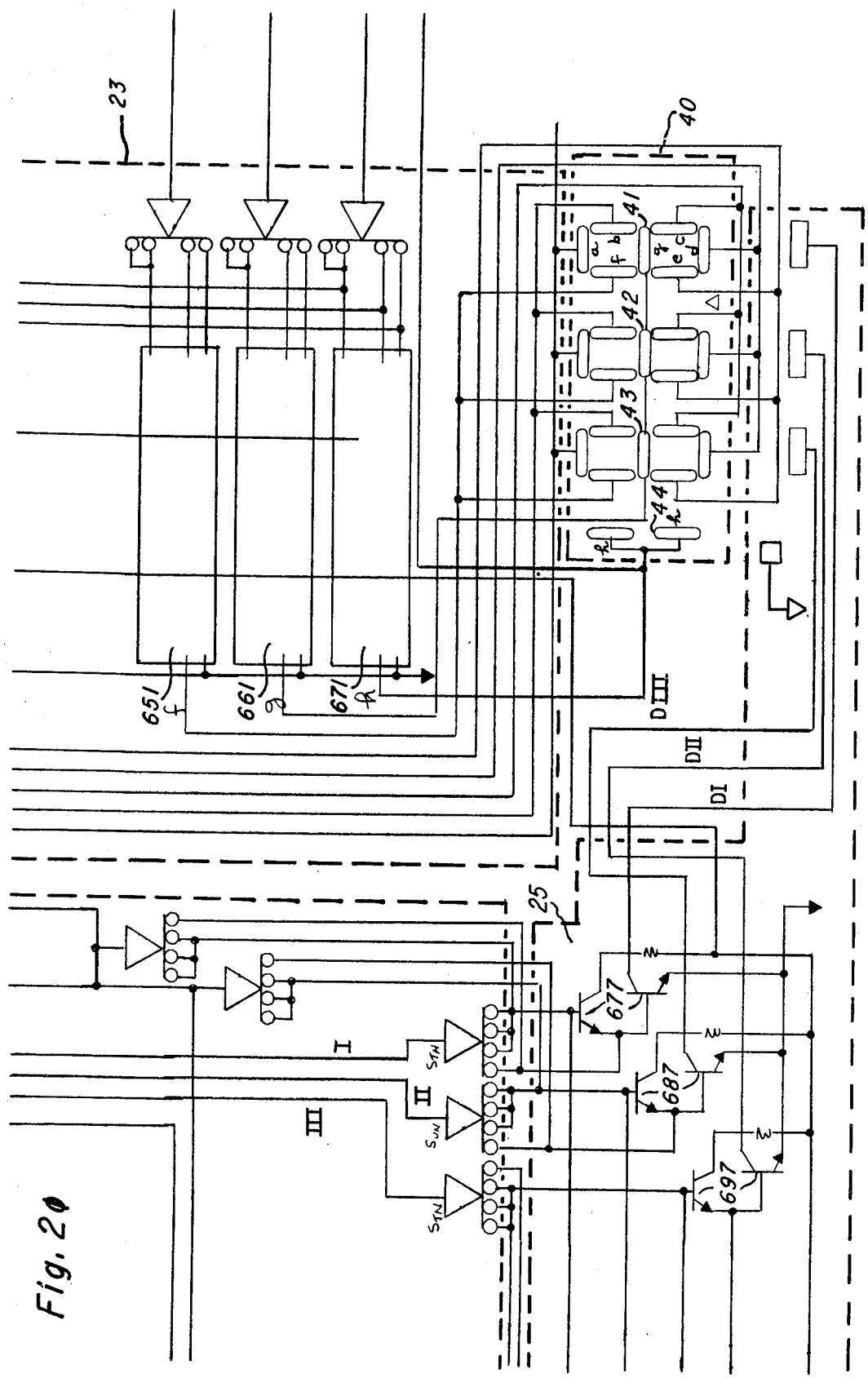

Three-state counter 26 is utilized to generate three instantaneous states of the analog-to-digital converter. Counter 26, shown in detail in FIG. 2g, is comprised of flip-flop circuits 701 and 702, each of the flip-flop circuits being identical to the flip-flop circuit illustrated in FIG. 3b. The duration of the clock signal applied to counter 26 during any particular state is governed by clock gate circuitry 12 which is coupled to the clock (CK) input of flip-flops 701–702. The output of flip-flop circuits 701 and 702 are decoded by a one-of-three decoder circuit 27 to generate the three operating states $T_0$, $T_1$ and $T_2$. During the time period $T_0$, capacitor $C_0$ is being discharged. The discharging of capacitor $C_0$, as previously discussed, is accomplished by controlling switch 29 which is coupled to the $T_0$ output of decoder circuit 27 by means of switch driver circuit 28. During the state $T_1$, integration progresses with voltage $V_A$ being applied to the input to integrator 14, and during state $T_2$, integration progresses with voltage $V_B$ being applied to the input to integrator 14. Switch 13, which controls the application of the voltage $V_A$ or $V_B$ to the input of integrator 14 is controlled by enable signal $E_O$ which is derived from decoder 27 to control switch 13 to input voltage $V_A$ during state $T_1$ and voltage $V_B$ during state $T_2$.

Unlike standard dual slope analog-to-digital converters which divide the states within a conversion sequence into three equal time periods (i.e., $T_0 = T_1 = T_2$), each being equal to the time required to count through all of the states of a digital counter, a counting scheme is utilized in the present system which is uniquely selected for each application. Firstly, the duration of each of the states $T_0$, $T_1$ and $T_2$ is individually selected to best suit the application, and may encompass a different number of counts of the counter, and therefore, be of different duration from one another. Secondly, the minimum measured parameter value may be given other than by the number 000 in order to best suit the application. In order to best understand the count scheme, the following exemplary discussion will be limited to the digital thermometer application, and more particularly, to a digital fever thermometer having a range limited to 95–108.5° F, or 35–42.5° C.

Decade counter 19a–19c, which count to 200 states in the present embodiment, are capable of resolution to one part in 200; however, for thermometer applicaton, each count is selected to represent 0.1° and the resolution is restricted below 1 in 200 parts to accommodate both Fahrenheit and Centigrade units. Considerable reduction in circuit components results in utilizing the count ranges indicated in Table II below.

TABLE II

|  | Fahrenheit | Centigrade |
|---|---|---|
| $T_0$ Count Range | 000–114 | 000–174 |
| No. of Counts in $T_O$ State | 115 | 175 |
| $T_1$ Count Range | 115–049 | 175–049 |
| No. of Counts in $T_1$ State | 135 | 75 |
| $T_2$ Count Range | 050–000 | 050–000 |
| No. of Counts in $T_2$ State | 150 | 150 |
| Temperature Range | 95.0–108.5° F | 35.0–42.5° C |
| Scale Range | 13.5° F | 7.5° C |

Two models may be provided utilizing the identical circuitry: a Fahrenheit model and a Centigrade model, or a single model incorporating the circuit may be provided which includes a selection switch to change from Fahrenheit to Centrigrade scale. The change is accomplished by gate 33 which causes clock gating circuit 32 to alter the number of counts in the $T_1$ mode in the respective models. Two passes through the counter states (a total of 400 counts ) is made; count 050 on the second pass (actually the 250th clock pulse in a conversion cycle) is utilized for minimum scale in both ° F and ° C models. Temperature range and scale range are the same in both models considering absolute temperature. However, resolution is closer in Fahrenheit than in Centigrade by the ratio of 1.8 to 1.0; the resolution is acceptable in both models because the resolution of 0.1° C is well within the requirements for a fever thermometer, and the convenience of relating one counter state to 0.1° in both the ° F or ° C system is very desirable. Higher resolutions may, of course, be accomplished by increasing the total number of counts provided by the counter.

The system parameters, selected in TABLE I for a fever thermometer, namely, 050 count for minimum scale and 0.1° increments for each count, als provide simplification of the circuitry which would otherwise be required for decoding the results of the conversion for a decimal display. The last two digits in the results of each conversion directly represent the desired last two digits to be displayed in both the Centigrade and Fahrenheit models; for example, count 050 represents 95.0°F or 35.0° C; and 099 represents 99.9° C; count of 125 represents 102.5° F and 42.5° C; etc. Another scheme which may be utilized in accordance with the invention would be to indicate the minimum temperature of 35.0° C (which is equal to 95.0° F) by a count of 350 (or 950 for ° F).

The above counting scheme is accomplished in the present embodiment by decoding selected state from counters 19a–19c in decoder circuits 31a–31c, and applying the decoded signals, along with an indication of the present state $T_1$, $T_1$ or $T_2$ from decoder circuit 27, to clock gating circuit 32. Clock gating circuit 32, illustrated in detail in FIG. 2g, is comprised of NAND gates 771–779 which received the above-indicated signals and provide a controlled clock signal to the clock (CK) input of latch circuits 701 and 702 comprising three-state counter 26. Overrange flip-flop 761, illustrated in detail in FIG. 2h, comprises overrange circuitry 30 which is capable of detecting an overrange condition in both ° C and ° F, overrange circuitry 30 being responsive to ° C/° F selection circuitry 33 and to the decoded output from decoder circuits 31a–31c. Overrange circuitry 30 is arranged to provide a predetermined display (e.g., all digits except hundreds blanked) by the occurrance of an overrange condition. Then encoder circuitry 34, also illustrated in detail in FIG. 2h, encodes the tens digit information derived from tens flip-flop 19c and stored in latch 20c and, the overrange information derived from flip-flop 761, to provide the binary coded dicimal equivalent of the tens digit $A_2B_2C_2D_2$. As previously mentioned, the tenths binary coded decimal digit $A_OB_OC_OD_O$ is stored in tenths latches 20a and the binary coded units digit $A_1B_1C_1D_1$ is stored in units latches 20b. The binary coded decimal bits comprising the tenths, units, and tens digits are then multiplexed by multiplex circuitry 22a which is controlled by scanning signals I, II and III from oscillartor circuitry 17. Thus, during the period in which signal I is being applied to NAND gate 280, the binary coded decimal equivalent of the tenths digit is applied via gates 219–222 to the four inputs of decoder 22b; during the period in which signal II is being applied to NAND gate 380, the binary coded decimal equivalent of the units digit is applied via NAND gate 319–322 to the four inputs of decoder 22b; and, during the period in which state III is being applied to NAND gate 480, the tens binary coded decimal digit generated by encoder circuit 34 is applied via gates 419–422 to the four inputs of decoder circuit 22b.

Figure 2P:
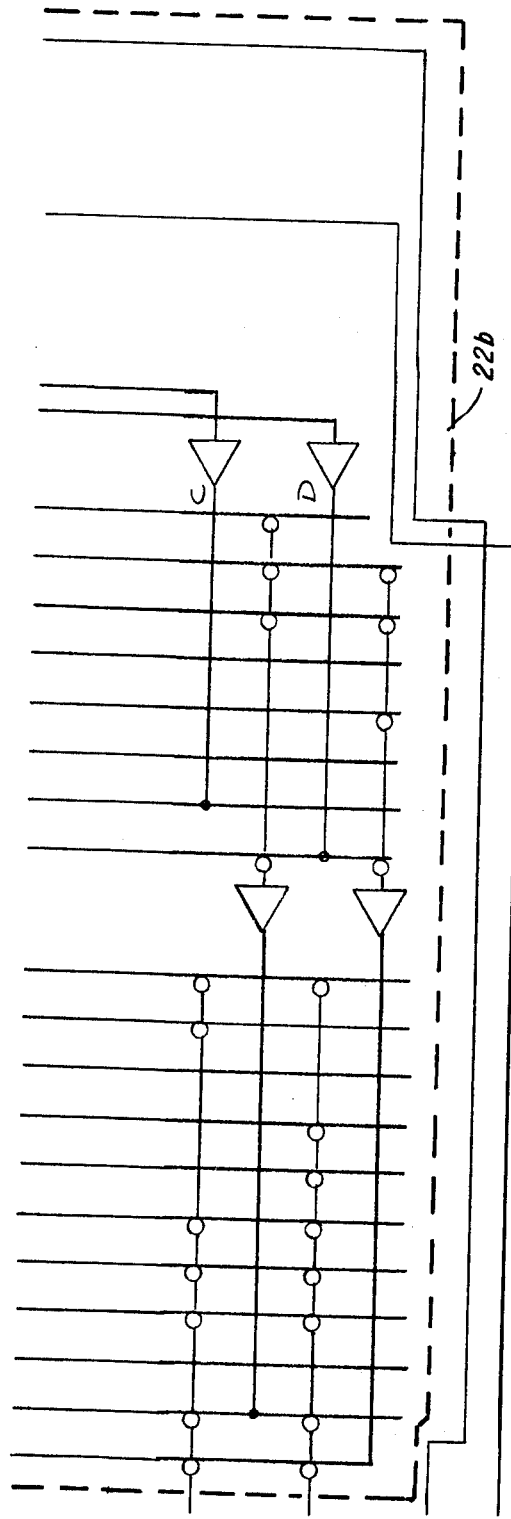

Decoder circuit 22b, illustrated in detail in FIGS. 21 and 2p, is a 4-line binary coded decimal to one-of-ten line decoder.

The ten lines providing the output of decoder 22b are coupled to the inputs of one-of-ten to seven-segment decoder and segment driver circuit 23. Decoder circuits 22b and 23, in combination therefore, covert one of the tenths, units or tens digits from binary coded decimal to seven segment format. The scanning signals I, II and III, which are applied to multiplexer circuit 22a, are also aplied to digit driver 25 comprised of driver transistor pairs 667, 687 and 697, respectively. Driver transistors 667, 687 and 697 provide digit driver signals DI, DII and DIII to drive the seven-segment display digits; such as, LED-type display digits 41-43, respectively. The two-segment hundredths digit 44 is driven directly by decoder circuit 67, and controlled by overrange circuitry 30. Thus, since the corresponding segments of the tenths, units, and tens digits 41-43 of display 40 are wired together at the LED anodes, for example, digit driver 667-697 apply appropriate (ground) signals DI, DII and DIII to the cathodes to allow only the desired digit simultaneously selected by multiplexing circuit 22a to be energized both under control of scanning signals I, II and III.

The analog-to-digital conversion circuit is capable of making a continuous series of conversion in the digital thermometer embodiment however, after the first conversion, thermistor $R_T$ is cooling down, and any reading derived therefrom would be erroneous; therefore, only the first conversion is accepted. display latch 25a, illustrated in detail in FIGS. 2n and 2o, is initialized to keep the display off with low battery drain until a first conversion is received. When latch circuit 25a is tripped by comparator latch 16, the display is turned on and further conversions are rejected.

As previously mentioned, to models °C and °F are provided by the illustrated circuit. A single connection to transistor 880 of select gating circuit 33, shown in detail in FIG. 2h, converts the °C range to the °F range. Where a hardwire is utilized, in accordance with a unique feature of an embodiment of the invention, the selection is made automatically. °C is automatically selected by connecting a three-digit display (tens, units and tenths) for a range of 35°-42.5° C, and °F is automatically selected when a four-digit display is connected to the circuit (hundredths, tens, units and tenths) for a range of 95° to 108.5° F; the emitter of transistor 880 being coupled to the circuit terminal pins which receive hundredths segments 44 of display 40.

A unique feature of the above-described digital thermometer is that all of the component circuits: operational amplifier 10 and 11, integrator 14 and analog comparator 15, as well as all of the digital circuitry, operate from a single low-voltage, low-power voltage supply. The single reference voltage utilized by all of the analog circuits is internally generated from the single low-power voltage supply. Where $V_{CC}$ is provided by, for example, a 5 volt (e.g., battery) supply, power consumption somewhat less than 50 mW for the entire circuit (not including the display drive power which varies according to the particular display utilized) is achievable.

Another unique feature of the digital thermometer is the provision made for calibration of the analog circuits. Calibration is accomplished by unique stepwise calibration circuit 35, illustrated in detail in FIGS. 2j and 2m. Calibration circuit 35 makes use of binary weighted current sources which may be activated in any combination by selective connection to sets 103, 104 and 110 of calibration terminals provided at a convenient point on the integrated circuit chip and/or through pins on the integrated circuit package. Three types of calibration are provided in the present embodiment. Offset calibration circuit 35a adjusts the zero scale value of the unknown parameter; slope calibration circuit 35b adjusts the full scale of the unknown parameter; and final trim circuit 35c adjusts the assembled digital thermometer for correct measurements to a bath of known standard temperature. No external components are required for calibration, only grounded or open circuit calibration terminals or pins. The usual problems encountered by analog circuits with potentiometer calibration are avoided (ie, drift from the calibrated condition).

Transistors 105, 106 and 111-116 are connected to provide a current sufficient to bias transistors 121-125, 131-134 and 141-142 at a particular current level. Resistors 107 and 108 provide current feedback for circuit stabilization and a voltage drop which is related to downward ratioing of successive current sources in the binary weighted string. In this embodiment, eleven current sources are provided: five, 121-125, for offset calibration; two, 141-142, for final trim and four, 131-134, for slope calibration. Offset current sources 121-125 and trim current sources 141-142, are collectively biased from the base of transistor 112; slope current sources 131-134 are biased from the base of transistor 114.

Offset current source transistors 121-125 are of successively smaller geometry so that approximately equal emitter-base voltage drops, at currents successively smaller by a factor of two, are maintained. Similar geometry adjustments are made in transistors 131-134 and 141-142, respectively. An example of emitter current and resistance values for the eleven current sources for one embodiment of the digital thermometer are shown in TABLE III.

TABLE III

| | TRANSISTOR CURRENT SOURCE REF. NUMBER | EMITTER RESISTOR VALUE | EMITTER CURRENT |
|---|---|---|---|
| OFFSET | 121 | 625 ohms | 160 µA |
| | 122 | 1250 ohms | 80 |
| | 123 | 2500 ohms | 40 |
| | 124 | 5000 ohms | 20 |
| | 125 | 10000 ohms | 10 |
| SLOPE | 131 | 625 ohms | 160 µA |
| | 132 | 1250 ohms | 80 |
| | 133 | 2500 ohms | 40 |
| | 134 | 5000 ohms | 20 |
| TRIM | 141 | 5000 ohms | 20 µA |
| | 142 | 10000 ohms | 10 |

Current sources 121-125, 131-134 and 141-142 of each calibration set, are individually selectively activated by grounding the terminals of the various emitter resistors which are each connected to a pin of the external sets of pins 103, 104 and 110, respectively. Thus, for offset calibration, the five IC package pins coupled to the set of terminals 103 provide 32 discrete conditions from zero to 310 µA in 10−µA steps. For calibration, the four IC package pins, coupled to terminals 110, allow sixteen steps from 10 to 300 µA in 20−µA steps. For final trim, the two package pins, coupled to terminals 104, provide four steps, 0 to 30 µA in 10−µA steps. These parameters are, of course, pertinent only to the example of TABLE III; it is obvious that any number of variations may be provided resulting in any desired number of calibration steps and current variations per step.

Offset and trim currents are summed at the collectors of the selected ones of transistors 121-125 and 141-142, and flow through resistor R9; slope currents are summed at the collectors of the selected ones of transistors 131-134, and flow through resistor R8. The other terminal of resistors R8 and R9 are connected to a 1.2- volt reference voltage provided by $V_{REF}$ regulator 12. The respective voltage drops across resistors R8 and R9 are then adjusted voltages programmed by external pin connections; these adjustable voltage drops are then respectively applied to operational amplifier circuits 10 and 11 to effect the desired calibration adjustments.

As previously discussed, the above-described system incorporates an analog-digital integrated circuit fabricated on a single semiconductor substrate. The analog and digital circuitry, being comprised of bipolar devices, are fabricated utilizing standard $I^2L$ technology. A P-type substrate having a P+ buried layer and an N-type epitaxial layer of between 0.2–0.3 mils (nominally about 0.25 mils) in thickness on the surface thereof it utilized.

The novel features of the invention have now been described in detail with respect to preferred embodiments thereof. Since it is obvious that many changes and modifications can be made in the above details without departing from the nature and spirit of the invention, it is understood that the invention is not to be limited to said details except as set forth in the appended claims.

What is claimed is:

1. A ring oscillator integrated circuit comprising:
   (a) a plurality of cascaded integrated injection logic gates coupled in a ring configuration;
   (b) current supply means for supplying injection current to each of said logic gates; and
   (c) an adjustable current sink coupled to said means for supplying injection current for controlling the amount of injection current applied to said logic gates, said adjustable current sink being comprised of a multicollector bipolar transistor having one of the collectors thereof coupled to said current supply means and a selected number of the remaining collectors thereof coupled in a feedback loop to the base of said transistor; wherein,
   (d) frequency adjustments are made by varying the amount of injection current applied to the logic gates by means of said adjustable current sink.

2. The ring oscillator circuit according to claim 1 including means for supplying injection current to said multicollector bipolar transistor.

3. A semiconductor current injection logic integrated circuit system comprising:
   (a) a first plurality of logic gates configured to perform a digital function;
   (b) means for supplying injection current to said first plurality of logic gates;
   (c) a ring oscillator circuit for generating a clock signal for said system, said ring oscillator circuit being comprised of a second plurality of cascaded logic gates coupled in a ring configuration to provide a plurality of astable states;
   (d) means for supplying injection current to the second plurality of logic gates of said ring oscillator circuit; and
   (e) a variable current sink comprised of a multicollector bipolar transistor wherein one of the collectors of said transistor is coupled to said means for supplying injection current to said second plurality of logic gates and a selected number of the remaining collectors are coupled in a feedback loop to the base of said transistor, and wherein said means for supplying injection current to said first plurality of logic gates is coupled to said transistor for applying injection current to said transistor.

4. The integrated circuit according to claim 3, wherein said second logic gates are NAND gates.

5. The integrated circuit according to claim 3, wherein said second logic gates are inverter gates.

6. A method of fabricating a ring oscillator integrated circuit having a plurality of cascaded bipolar current injection logic gates coupled in a ring configuraton, current supply means for applying injection current to each of said logic gates and current sink means comprised of a multicollector bipolar transistor having one of the collectors thereof coupled to said current supply means for drawing current therefrom including the steps of:
   (a) providing means by which a predetermined quantity of injection current is supplied to said multicollector bipolar transistor, and
   (b) connecting a selected number of the remaining collectors of said multicollector bipolar transistor in a feedback loop to the base of said transistor, the frequency of said oscillator being controlled by the amount of injection current applied to said logic gates.

7. A method of fabricating current injection logic integrated circuits having frequency adjusted ring oscillator circuits incorporated therein with each of said ring oscillator circuits being comprised of a plurality of cascaded current injection logic gates coupled in a ring configuration, current supply means for applying injection current to each of said logic gates and current sink means comprised of a multicollector bipolar transistor wherein one of the collectors of said transistor is coupled to said current supply means for drawing a selected amount of current therefrom, said method comprising the steps of:
   (a) fabricating a first one of said integrated circuits with a selected number of the remaining collectors of said multicollector bipolar transistor coupled in a feedback loop to the base of said transistor;
   (b) supplying injection current to said multicollector bipolar transistor of said first integrated circuit;
   (c) testing the frequency of the ring oscillator circuit of said first integrated circuit;
   (d) adjusting the frequency of said first integrated circuit by adding or removing interconnects between said remaining collectors and said feedback loop until a desired frequency is achieved, and
   (e) fabricating the remainder of the integrated circuits utilizing the same number of collectors as said first adjusted integrated circuit.

* * * * *